(12) United States Patent
Sorrells et al.

(10) Patent No.: US 6,704,549 B1
(45) Date of Patent: Mar. 9, 2004

(54) MULTI-MODE, MULTI-BAND COMMUNICATION SYSTEM

(75) Inventors: David F. Sorrells, Jacksonville, FL (US); Michael J. Bultman, Jacksonville, FL (US); Charles D. Clements, Jacksonville, FL (US); Robert W. Cook, Switzerland, FL (US); Joseph M. Hamilla, St. Augustine, FL (US); Richard C. Looke, Jacksonville, FL (US); Charley D. Moses, Jr., Jacksonville, FL (US); Gregory S. Silver, St. Augustine, FL (US)

(73) Assignee: ParkVision, Inc., Jacksonville, FL (US)

(*) Notice: Subject to any disclaimer, the term of this patent is extended or adjusted under 35 U.S.C. 154(b) by 0 days.

(21) Appl. No.: 09/476,330

(22) Filed: Jan. 3, 2000

Related U.S. Application Data

(60) Provisional application No. 60/122,805, filed on Mar. 3, 1999.

(51) Int. Cl.[7] .................................................. H04B 1/66
(52) U.S. Cl. ..................................................... 455/102
(58) Field of Search .............................. 455/118, 115.1, 455/103, 102, 126, 127, 129, 295, 110, 119, 313, 323, 333, 314, 20, 207, 307, 553, 554, 555, 114.1–114.3, 104, 108–113; 375/285, 346, 350

(56) References Cited

U.S. PATENT DOCUMENTS

| | | | |
|---|---|---|---|
| 2,057,613 A | 10/1936 | Gardner | 250/8 |
| 2,241,078 A | 5/1941 | Vreeland | 179/15 |
| 2,270,385 A | 1/1942 | Skillman | 179/15 |
| 2,283,575 A | 5/1942 | Roberts | 250/6 |
| 2,358,152 A | 9/1944 | Earp | 179/171.5 |
| 2,410,350 A | 10/1946 | Labin et al. | 179/15 |
| 2,451,430 A | 10/1948 | Barone | 250/8 |
| 2,462,069 A | 2/1949 | Chatterjea et al. | 250/17 |
| 2,462,181 A | 2/1949 | Grosselfinger | 250/17 |
| 2,472,798 A | 6/1949 | Fredendall | 178/44 |
| 2,497,859 A | 2/1950 | Boughtwood et al. | 250/8 |
| 2,499,279 A | 2/1950 | Peterson | 332/41 |
| 2,802,208 A | 8/1957 | Hobbs | 343/176 |
| 2,985,875 A | 5/1961 | Grisdale et al. | 343/100 |

(List continued on next page.)

FOREIGN PATENT DOCUMENTS

| | | | |
|---|---|---|---|
| DE | 35 41 031 A1 | 5/1986 | H03D/3/00 |
| DE | 42 37 692 C1 | 3/1994 | H04B/1/26 |
| DE | 196 27 640 A1 | 1/1997 | H03D/7/12 |

(List continued on next page.)

OTHER PUBLICATIONS

Tayloe, D., "A Low–noise, High–performance Zero IF Quadrature Detector/Preamplifier," *RF Design*, pp. 58, 60, 62 and 69 (Mar. 2003).

Translation of Japanese Patent Publication No. 60–130203, 3 pages (Jul. 11, 1985– Date of publication of application).

Razavi, B., "A 900–MHz/1.8Ghz CMOS Transmitter for Dual–Band Applications," *Symposium on VLSI Circuits Digest of Technical Papers*, IEEE, pp. 128–131 (1998).

(List continued on next page.)

*Primary Examiner*—Marsha D. Banks-Harold
*Assistant Examiner*—N Mehrpour
(74) *Attorney, Agent, or Firm*—Sterne, Kessler, Goldstein & Fox, P.L.L.C.

(57) ABSTRACT

The present invention is directed toward the transmission subsystem of a multi-mode, multi-band communication system that can transmit and/or receive one or more information signals on one or more transmission frequencies using one or more modulation schemes. According to embodiments of the invention, the up-conversion section is implemented using a universal frequency translator (UFT).

104 Claims, 7 Drawing Sheets

U.S. PATENT DOCUMENTS

| | | | |
|---|---|---|---|
| 3,023,309 A | 2/1962 | Foulkes | 250/17 |
| 3,069,679 A | 12/1962 | Sweeney et al. | 343/200 |
| 3,104,393 A | 9/1963 | Vogelman | 343/200 |
| 3,114,106 A | 12/1963 | McManus | 325/56 |
| 3,118,117 A | 1/1964 | King et al. | 332/22 |
| 3,226,643 A | 12/1965 | McNair | 325/40 |
| 3,246,084 A | 4/1966 | Kryter | |
| 3,258,694 A | 6/1966 | Shepherd | 325/145 |
| 3,383,598 A | 5/1968 | Sanders | 325/163 |
| 3,384,822 A | 5/1968 | Miyagi | 325/30 |
| 3,454,718 A | 7/1969 | Perreault | 178/66 |
| 3,523,291 A | 8/1970 | Pierret | 340/347 |
| 3,548,342 A | 12/1970 | Maxey | 332/9 |
| 3,555,428 A | 1/1971 | Perreault | 325/320 |
| 3,617,892 A | 11/1971 | Hawley et al. | 325/145 |
| 3,621,402 A | 11/1971 | Gardner | 328/37 |
| 3,622,885 A | 11/1971 | Oberdorf et al. | 325/40 |
| 3,623,160 A | 11/1971 | Giles et al. | 340/347 DA |
| 3,626,417 A | 12/1971 | Gilbert | 343/203 |
| 3,629,696 A | 12/1971 | Bartelink | 324/57 R |
| 3,662,268 A | 5/1972 | Gans et al. | 325/65 |
| 3,689,841 A | 9/1972 | Bello et al. | 325/39 |
| 3,702,440 A * | 11/1972 | Moore | 325/55 |
| 3,714,577 A | 1/1973 | Hayes | 325/145 |
| 3,716,730 A | 2/1973 | Cerny, Jr. | 325/295 |
| 3,717,844 A | 2/1973 | Barret et al. | 340/5 R |
| 3,735,048 A | 5/1973 | Tomsa et al. | 179/15 BM |
| 3,767,984 A * | 10/1973 | Shinoda et al. | 317/235 |
| 3,806,811 A | 4/1974 | Thompson | 325/146 |
| 3,852,530 A * | 12/1974 | Shen | 179/1 |
| 3,868,601 A | 2/1975 | MacAfee | 332/45 |
| 3,949,300 A | 4/1976 | Sadler | 325/31 |
| 3,967,202 A | 6/1976 | Batz | 325/31 |
| 3,980,945 A | 9/1976 | Bickford | 325/30 |
| 3,987,280 A | 10/1976 | Bauer | 235/150.53 |
| 3,991,277 A | 11/1976 | Hirata | 179/15 FD |
| 4,003,002 A | 1/1977 | Snijders et al. | 332/10 |
| 4,013,966 A | 3/1977 | Campbell | 325/363 |
| 4,017,798 A | 4/1977 | Gordy et al. | 325/42 |
| 4,019,140 A | 4/1977 | Swerdlow | 322/65 |
| 4,032,847 A | 6/1977 | Unkauf | 325/323 |
| 4,035,732 A | 7/1977 | Lohrmann | 325/446 |
| 4,047,121 A | 9/1977 | Campbell | 331/76 |
| 4,051,475 A | 9/1977 | Campbell | 343/180 |
| 4,066,841 A | 1/1978 | Young | 178/66 R |
| 4,066,919 A | 1/1978 | Huntington | 307/353 |
| 4,080,573 A | 3/1978 | Howell | 325/439 |
| 4,081,748 A | 3/1978 | Batz | 325/56 |
| 4,130,765 A | 12/1978 | Arakelian et al. | 307/220 R |
| 4,130,806 A | 12/1978 | Van Gerwen et al. | 325/487 |
| 4,142,155 A | 2/1979 | Adachi | 325/47 |
| 4,170,764 A | 10/1979 | Salz et al. | 332/17 |
| 4,204,171 A | 5/1980 | Sutphin, Jr. | 328/167 |
| 4,210,872 A | 7/1980 | Gregorian | 330/9 |
| 4,220,977 A | 9/1980 | Yamanaka | |
| 4,245,355 A | 1/1981 | Pascoe et al. | 455/326 |
| 4,253,066 A | 2/1981 | Fisher et al. | 329/50 |
| 4,253,067 A | 2/1981 | Caples et al. | 329/110 |
| 4,253,069 A | 2/1981 | Nossek | 330/107 |
| 4,308,614 A | 12/1981 | Fisher et al. | 370/119 |
| 4,320,361 A | 3/1982 | Kikkert | 332/16 R |
| 4,320,536 A | 3/1982 | Dietrich | 455/325 |
| 4,334,324 A | 6/1982 | Hoover | 455/333 |
| 4,346,477 A | 8/1982 | Gordy | 455/257 |
| 4,355,401 A | 10/1982 | Ikoma et al. | 375/5 |
| 4,356,558 A | 10/1982 | Owen et al. | 364/724 |
| 4,360,867 A | 11/1982 | Gonda | 363/158 |
| 4,363,132 A | 12/1982 | Collin | 455/52 |
| 4,365,217 A | 12/1982 | Berger et al. | 333/165 |
| 4,369,522 A | 1/1983 | Cerny, Jr. et al. | 455/333 |
| 4,370,572 A | 1/1983 | Cosand et al. | 307/353 |
| 4,384,357 A | 5/1983 | deBuda et al. | |
| 4,389,579 A | 6/1983 | Stein | 307/353 |
| 4,392,255 A | 7/1983 | Del Giudice | 455/328 |
| 4,393,395 A | 7/1983 | Hacke et al. | 358/23 |
| 4,430,629 A | 2/1984 | Betzl et al. | 333/165 |
| 4,446,438 A | 5/1984 | Chang et al. | 328/127 |
| 4,456,990 A | 6/1984 | Fisher et al. | 370/119 |
| 4,470,145 A | 9/1984 | Williams | |
| 4,472,785 A | 9/1984 | Kasuga | 364/718 |
| 4,479,226 A | 10/1984 | Prabhu et al. | 375/1 |
| 4,481,490 A | 11/1984 | Huntley | 332/41 |
| 4,481,642 A | 11/1984 | Hanson | 375/9 |
| 4,483,017 A | 11/1984 | Hampel et al. | 382/17 |
| 4,484,143 A | 11/1984 | French et al. | 329/50 |
| 4,485,488 A | 11/1984 | Houdart | 455/327 |
| 4,504,803 A | 3/1985 | Lee et al. | 332/31 R |
| 4,517,519 A | 5/1985 | Mukaiyama | 329/126 |
| 4,517,520 A | 5/1985 | Ogawa | 329/145 |
| 4,518,935 A | 5/1985 | van Roermund | 333/173 |
| 4,521,892 A | 6/1985 | Vance et al. | 375/88 |
| 4,563,773 A | 1/1986 | Dixon, Jr. et al. | 455/327 |
| 4,577,157 A | 3/1986 | Reed | 329/50 |
| 4,583,239 A | 4/1986 | Vance | 375/94 |
| 4,591,736 A | 5/1986 | Hirao et al. | 307/267 |
| 4,602,220 A | 7/1986 | Kurihara | 331/19 |
| 4,603,300 A | 7/1986 | Welles, II et al. | 329/50 |
| 4,612,464 A | 9/1986 | Ishikawa et al. | 307/496 |
| 4,612,518 A | 9/1986 | Gans et al. | 332/21 |
| 4,616,191 A | 10/1986 | Galani et al. | 331/4 |
| 4,621,217 A | 11/1986 | Saxe et al. | 315/1 |
| 4,628,517 A | 12/1986 | Schwarz et al. | 375/40 |
| 4,634,998 A | 1/1987 | Crawford | 331/1 A |
| 4,648,021 A | 3/1987 | Alberkrack | 363/157 |
| 4,651,034 A | 3/1987 | Sato | 307/556 |
| 4,653,117 A | 3/1987 | Heck | 455/209 |
| 4,675,882 A | 6/1987 | Lillie et al. | 375/80 |
| 4,688,253 A | 8/1987 | Gumm | 381/7 |
| 4,716,376 A | 12/1987 | Daudelin | 329/107 |
| 4,716,388 A | 12/1987 | Jacobs | 333/173 |
| 4,718,113 A | 1/1988 | Rother et al. | 455/209 |
| 4,726,041 A | 2/1988 | Prohaska et al. | 375/91 |
| 4,733,403 A | 3/1988 | Simone | 375/103 |
| 4,734,591 A | 3/1988 | Ichitsubo | 307/219.1 |
| 4,737,969 A | 4/1988 | Steel et al. | 375/67 |
| 4,743,858 A | 5/1988 | Everard | 330/10 |
| 4,745,463 A | 5/1988 | Lu | 358/23 |
| 4,751,468 A | 6/1988 | Agoston | 328/133 |
| 4,757,538 A | 7/1988 | Zink | 381/7 |
| 4,768,187 A | 8/1988 | Marshall | 370/69.1 |
| 4,769,612 A | 9/1988 | Tamakoshi et al. | 328/167 |
| 4,785,463 A | 11/1988 | Janc et al. | 375/1 |
| 4,791,584 A | 12/1988 | Greivenkamp, Jr. | 364/525 |
| 4,801,823 A | 1/1989 | Yokoyama | 307/353 |
| 4,806,790 A | 2/1989 | Sone | 307/353 |
| 4,810,904 A | 3/1989 | Crawford | 307/353 |
| 4,810,976 A | 3/1989 | Cowley et al. | 331/117 R |
| 4,811,362 A | 3/1989 | Yester, Jr. et al. | 375/75 |
| 4,816,704 A | 3/1989 | Fiori, Jr. | 307/519 |
| 4,819,252 A | 4/1989 | Christopher | 375/122 |
| 4,833,445 A | 5/1989 | Buchele | 341/118 |
| 4,841,265 A | 6/1989 | Watanabe et al. | 333/194 |
| 4,855,894 A | 8/1989 | Asahi et al. | 363/157 |
| 4,862,121 A | 8/1989 | Hochschild et al. | 333/173 |
| 4,868,654 A | 9/1989 | Juri et al. | 358/133 |
| 4,870,659 A | 9/1989 | Oishi et al. | 375/82 |
| 4,871,987 A | 10/1989 | Kawase | 332/100 |
| 4,885,587 A | 12/1989 | Wiegand et al. | 42/14 |
| 4,885,756 A | 12/1989 | Fontanes et al. | 375/82 |
| 4,888,557 A | 12/1989 | Puckette, IV et al. | 329/341 |
| 4,890,302 A | 12/1989 | Muilwijk | 375/80 |

| Patent | Date | Inventor | Class |
|---|---|---|---|
| 4,893,316 A | 1/1990 | Janc et al. | 375/44 |
| 4,893,341 A | 1/1990 | Gehring | 381/7 |
| 4,894,766 A | 1/1990 | De Agro | 363/159 |
| 4,896,152 A | 1/1990 | Tiemann | 340/853 |
| 4,902,979 A | 2/1990 | Puckette, IV | 329/343 |
| 4,908,579 A | 3/1990 | Tawfik et al. | 328/167 |
| 4,910,752 A | 3/1990 | Yester, Jr. et al. | 375/75 |
| 4,914,405 A | 4/1990 | Wells | 331/25 |
| 4,920,510 A | 4/1990 | Senderowicz et al. | 364/825 |
| 4,922,452 A | 5/1990 | Larsen et al. | 365/45 |
| 4,931,921 A | 6/1990 | Anderson | 363/163 |
| 4,943,974 A | 7/1990 | Motamedi | 375/1 |
| 4,944,025 A | 7/1990 | Gehring et al. | 455/207 |
| 4,955,079 A | 9/1990 | Connerney et al. | 455/325 |
| 4,965,467 A | 10/1990 | Bilterijst | 307/352 |
| 4,967,160 A | 10/1990 | Quievy et al. | 328/16 |
| 4,970,703 A | 11/1990 | Hariharan et al. | 367/138 |
| 4,982,353 A | 1/1991 | Jacob et al. | 364/724.1 |
| 4,984,077 A | 1/1991 | Uchida | 358/140 |
| 4,995,055 A | 2/1991 | Weinberger et al. | 375/5 |
| 5,003,621 A | 3/1991 | Gailus | 455/209 |
| 5,005,169 A | 4/1991 | Bronder et al. | 370/76 |
| 5,006,810 A | 4/1991 | Popescu | 328/167 |
| 5,010,585 A | 4/1991 | Garcia | 455/118 |
| 5,014,304 A | 5/1991 | Nicollini et al. | 379/399 |
| 5,015,963 A | 5/1991 | Sutton | 329/361 |
| 5,016,242 A * | 5/1991 | Tang | 370/3 |
| 5,017,924 A | 5/1991 | Guiberteau et al. | 342/195 |
| 5,020,149 A | 5/1991 | Hemmie | 455/325 |
| 5,020,154 A | 5/1991 | Zierhut | 455/608 |
| 5,052,050 A | 9/1991 | Collier et al. | 455/296 |
| 5,065,409 A | 11/1991 | Hughes et al. | 375/91 |
| 5,083,050 A | 1/1992 | Vasile | 307/529 |
| 5,091,921 A | 2/1992 | Minami | 375/88 |
| 5,095,533 A | 3/1992 | Loper et al. | 455/245 |
| 5,095,536 A | 3/1992 | Loper | 455/324 |
| 5,111,152 A | 5/1992 | Makino | 329/300 |
| 5,113,094 A | 5/1992 | Grace et al. | 307/529 |
| 5,113,129 A | 5/1992 | Hughes | 323/316 |
| 5,115,409 A | 5/1992 | Stepp | 364/841 |
| 5,122,765 A | 6/1992 | Pataut | 332/105 |
| 5,124,592 A | 6/1992 | Hagino | 307/520 |
| 5,126,682 A | 6/1992 | Weinberg et al. | 329/304 |
| 5,136,267 A | 8/1992 | Cabot | 333/174 |
| 5,140,705 A | 8/1992 | Kosuga | 455/318 |
| 5,150,124 A | 9/1992 | Moore et al. | 342/68 |
| 5,151,661 A | 9/1992 | Caldwell et al. | 328/14 |
| 5,157,687 A | 10/1992 | Tymes | 375/1 |
| 5,159,710 A | 10/1992 | Cusdin | 455/304 |
| 5,170,414 A | 12/1992 | Silvian | 375/59 |
| 5,172,070 A | 12/1992 | Hiraiwa et al. | 329/304 |
| 5,191,459 A | 3/1993 | Thompson et al. | 359/133 |
| 5,204,642 A | 4/1993 | Ashgar et al. | 331/135 |
| 5,212,827 A | 5/1993 | Meszko et al. | 455/219 |
| 5,214,787 A | 5/1993 | Karkota, Jr. | 455/3.2 |
| 5,220,583 A | 6/1993 | Solomon | 375/82 |
| 5,220,680 A | 6/1993 | Lee | 455/102 |
| 5,222,144 A | 6/1993 | Whikehart | 381/15 |
| 5,230,097 A | 7/1993 | Currie et al. | 455/226.1 |
| 5,239,686 A | 8/1993 | Downey | 455/78 |
| 5,241,561 A | 8/1993 | Barnard | 375/1 |
| 5,249,203 A | 9/1993 | Loper | 375/97 |
| 5,251,218 A | 10/1993 | Stone et al. | 370/120 |
| 5,251,232 A | 10/1993 | Nonami | 375/5 |
| 5,260,970 A | 11/1993 | Henry et al. | 375/10 |
| 5,263,194 A | 11/1993 | Ragan | 455/316 |
| 5,263,196 A | 11/1993 | Jasper | 455/324 |
| 5,267,023 A | 11/1993 | Kawasaki | 358/23 |
| 5,278,826 A | 1/1994 | Murphy et al. | 370/76 |
| 5,282,023 A | 1/1994 | Scarpa | 358/36 |
| 5,287,516 A | 2/1994 | Schaub | 375/88 |
| 5,293,398 A | 3/1994 | Hamao et al. | 375/1 |
| 5,303,417 A | 4/1994 | Laws | 455/314 |
| 5,307,517 A | 4/1994 | Rich | 455/306 |
| 5,315,583 A | 5/1994 | Murphy et al. | 370/18 |
| 5,319,799 A | 6/1994 | Morita | 455/78 |
| 5,321,852 A | 6/1994 | Seong | 455/182.1 |
| 5,325,204 A | 6/1994 | Scarpa | 348/607 |
| 5,337,014 A | 8/1994 | Najle et al. | 324/613 |
| 5,339,054 A | 8/1994 | Taguchi | 332/100 |
| 5,339,459 A | 8/1994 | Schiltz et al. | 455/333 |
| 5,353,306 A | 10/1994 | Yamamoto | 375/14 |
| 5,355,114 A | 10/1994 | Sutterlin et al. | 340/310 A |
| 5,361,408 A | 11/1994 | Watanabe et al. | 455/324 |
| 5,369,404 A | 11/1994 | Galton | 341/143 |
| 5,369,800 A | 11/1994 | Takagi et al. | 455/59 |
| 5,375,146 A | 12/1994 | Chalmers | 375/103 |
| 5,379,040 A | 1/1995 | Mizomoto et al. | 341/143 |
| 5,379,141 A | 1/1995 | Thompson et al. | 359/125 |
| 5,388,063 A | 2/1995 | Takatori et al. | 364/724.17 |
| 5,390,364 A | 2/1995 | Webster et al. | 455/52.3 |
| 5,400,084 A | 3/1995 | Scarpa | 348/624 |
| 5,404,127 A | 4/1995 | Lee et al. | 340/310.02 |
| 5,410,541 A | 4/1995 | Hotto | 370/76 |
| 5,410,743 A | 4/1995 | Seely et al. | 455/326 |
| 5,412,352 A | 5/1995 | Graham | 332/103 |
| 5,416,803 A | 5/1995 | Janer | 375/324 |
| 5,422,913 A | 6/1995 | Wilkinson | 375/347 |
| 5,423,082 A | 6/1995 | Cygan et al. | 455/126 |
| 5,428,638 A | 6/1995 | Cioffi et al. | 375/224 |
| 5,428,640 A | 6/1995 | Townley | 375/257 |
| 5,434,546 A | 7/1995 | Palmer | 332/151 |
| 5,438,692 A | 8/1995 | Mohindra | 455/324 |
| 5,444,415 A | 8/1995 | Dent et al. | 329/302 |
| 5,444,416 A | 8/1995 | Ishikawa et al. | 329/341 |
| 5,444,865 A | 8/1995 | Heck et al. | 455/86 |
| 5,446,421 A | 8/1995 | Kechkaylo | 332/100 |
| 5,446,422 A | 8/1995 | Mattila et al. | 332/103 |
| 5,448,602 A | 9/1995 | Ohmori et al. | 375/347 |
| 5,451,899 A | 9/1995 | Lawton | 329/302 |
| 5,454,007 A | 9/1995 | Dutta | 375/322 |
| 5,454,009 A | 9/1995 | Fruit et al. | 372/202 |
| 5,463,356 A | 10/1995 | Palmer | 332/117 |
| 5,463,357 A | 10/1995 | Hobden | 332/151 |
| 5,465,071 A | 11/1995 | Kobayashi et al. | 329/315 |
| 5,465,410 A | 11/1995 | Hiben et al. | 455/266 |
| 5,465,415 A | 11/1995 | Bien | 455/326 |
| 5,465,418 A | 11/1995 | Zhou et al. | 455/332 |
| 5,471,162 A | 11/1995 | McEwan | 327/92 |
| 5,479,120 A | 12/1995 | McEwan | 327/91 |
| 5,479,447 A | 12/1995 | Chow et al. | 375/260 |
| 5,483,193 A | 1/1996 | Kennedy et al. | 329/300 |
| 5,483,549 A | 1/1996 | Weinberg et al. | 375/200 |
| 5,483,691 A | 1/1996 | Heck et al. | 455/234.2 |
| 5,490,173 A | 2/1996 | Whikehart et al. | 375/316 |
| 5,493,581 A | 2/1996 | Young et al. | 375/350 |
| 5,493,721 A | 2/1996 | Reis | 455/339 |
| 5,495,200 A | 2/1996 | Kwan et al. | 327/554 |
| 5,495,202 A | 2/1996 | Hsu | 327/113 |
| 5,495,500 A | 2/1996 | Jovanovich et al. | 375/206 |
| 5,499,267 A | 3/1996 | Ohe et al. | 375/206 |
| 5,500,758 A | 3/1996 | Thompson et al. | 359/189 |
| 5,513,389 A | 4/1996 | Reeser et al. | 455/311 |
| 5,515,014 A | 5/1996 | Troutman | 332/178 |
| 5,517,688 A | 5/1996 | Fajen et al. | 455/333 |
| 5,519,890 A | 5/1996 | Pinckley | 455/307 |
| 5,523,719 A | 6/1996 | Longo et al. | 327/557 |
| 5,523,726 A | 6/1996 | Kroeger et al. | 332/103 |
| 5,523,760 A | 6/1996 | McEwan | 342/89 |
| 5,539,770 A | 7/1996 | Ishigaki | 375/206 |
| 5,555,453 A | 9/1996 | Kajimoto et al. | 455/266 |
| 5,557,641 A | 9/1996 | Weinberg | 375/295 |

| Patent | Date | Inventor | Class |
|---|---|---|---|
| 5,557,642 A | 9/1996 | Williams | 375/316 |
| 5,563,550 A | 10/1996 | Toth | 329/347 |
| 5,574,755 A | 11/1996 | Persico | 375/295 |
| 5,579,341 A | 11/1996 | Smith et al. | 375/267 |
| 5,579,347 A | 11/1996 | Lindquist et al. | 375/346 |
| 5,584,068 A | 12/1996 | Mohindra | 455/324 |
| 5,592,131 A | 1/1997 | Labreche et al. | 332/103 |
| 5,600,680 A | 2/1997 | Mishima et al. | |
| 5,602,847 A | 2/1997 | Pagano et al. | 370/484 |
| 5,602,868 A | 2/1997 | Wilson | 375/219 |
| 5,604,592 A | 2/1997 | Kotidis et al. | 356/357 |
| 5,604,732 A | 2/1997 | Kim et al. | 370/342 |
| 5,606,731 A | 2/1997 | Pace et al. | |
| 5,608,531 A | 3/1997 | Honda et al. | 386/1 |
| 5,610,946 A | 3/1997 | Tanaka et al. | 375/269 |
| RE35,494 E | 4/1997 | Nicollini | 327/554 |
| 5,617,451 A | 4/1997 | Mimura et al. | 375/340 |
| 5,619,538 A | 4/1997 | Sempel et al. | 375/328 |
| 5,621,455 A | 4/1997 | Rogers et al. | 348/6 |
| 5,628,055 A | 5/1997 | Stein | 455/89 |
| 5,630,227 A | 5/1997 | Bella et al. | 455/324 |
| 5,633,815 A | 5/1997 | Young | |
| 5,638,396 A | 6/1997 | Klimek | 372/92 |
| 5,640,415 A | 6/1997 | Pandula | 375/202 |
| 5,640,424 A | 6/1997 | Banavong et al. | 375/316 |
| 5,640,428 A | 6/1997 | Abe et al. | 375/334 |
| 5,640,698 A | 6/1997 | Shen et al. | 455/323 |
| 5,648,985 A | 7/1997 | Bjerede et al. | 375/219 |
| 5,650,785 A | 7/1997 | Rodal | 342/357 |
| 5,661,424 A | 8/1997 | Tang | 327/105 |
| 5,663,878 A | 9/1997 | Walker | 363/159 |
| 5,663,986 A | 9/1997 | Striffler | 375/260 |
| 5,668,836 A | 9/1997 | Smith et al. | 375/316 |
| 5,675,392 A | 10/1997 | Nayebi et al. | 348/584 |
| 5,678,220 A | 10/1997 | Fournier | 455/302 |
| 5,680,078 A | 10/1997 | Ariie | 332/178 |
| 5,680,418 A | 10/1997 | Croft et al. | 375/346 |
| 5,689,413 A | 11/1997 | Jaramillo et al. | 363/146 |
| 5,694,096 A | 12/1997 | Ushiroku et al. | 333/195 |
| 5,699,006 A | 12/1997 | Zele et al. | 327/341 |
| 5,705,949 A | 1/1998 | Alelyunas et al. | 329/304 |
| 5,705,955 A | 1/1998 | Freeburg et al. | 331/14 |
| 5,710,998 A | 1/1998 | Opas | 455/324 |
| 5,714,910 A | 2/1998 | Skoczen et al. | 331/3 |
| 5,715,281 A | 2/1998 | Bly et al. | 375/344 |
| 5,721,514 A | 2/1998 | Crockett et al. | 331/3 |
| 5,724,002 A | 3/1998 | Hulick | 329/361 |
| 5,724,653 A | 3/1998 | Baker et al. | 455/296 |
| 5,729,577 A | 3/1998 | Chen | 375/334 |
| 5,729,829 A | 3/1998 | Talwar et al. | 455/63 |
| 5,732,333 A | 3/1998 | Cox et al. | 455/126 |
| 5,736,895 A | 4/1998 | Yu et al. | 327/554 |
| 5,737,035 A | 4/1998 | Rotzoll | 348/725 |
| 5,742,189 A | 4/1998 | Yoshida et al. | 327/113 |
| 5,748,683 A | 5/1998 | Smith et al. | 375/347 |
| 5,757,870 A | 5/1998 | Miya et al. | 375/367 |
| RE35,829 E | 6/1998 | Sanderford, Jr. | 375/200 |
| 5,760,645 A | 6/1998 | Comte et al. | 329/304 |
| 5,764,087 A | 6/1998 | Clark | 327/105 |
| 5,767,726 A | 6/1998 | Wang | 327/356 |
| 5,768,118 A | 6/1998 | Faulk et al. | 363/72 |
| 5,768,323 A | 6/1998 | Kroeger et al. | 375/355 |
| 5,770,985 A | 6/1998 | Ushiroku et al. | 333/193 |
| 5,771,442 A | 6/1998 | Wang et al. | 455/93 |
| 5,777,692 A | 7/1998 | Ghosh | 348/725 |
| 5,777,771 A | 7/1998 | Smith | 359/180 |
| 5,778,022 A | 7/1998 | Walley | 375/206 |
| 5,786,844 A | 7/1998 | Rogers et al. | 348/6 |
| 5,793,801 A | 8/1998 | Fertner | 375/219 |
| 5,793,818 A | 8/1998 | Claydon et al. | 375/326 |
| 5,801,654 A | 9/1998 | Traylor | 341/144 |
| 5,802,463 A | 9/1998 | Zuckerman | 455/208 |
| 5,809,060 A | 9/1998 | Cafarella et al. | 375/206 |
| 5,812,546 A | 9/1998 | Zhou et al. | 370/342 |
| 5,818,582 A | 10/1998 | Fernandez et al. | 356/318 |
| 5,818,869 A | 10/1998 | Miya et al. | 375/206 |
| 5,825,254 A | 10/1998 | Lee | 331/25 |
| 5,834,985 A | 11/1998 | Sundegård | 332/100 |
| 5,841,324 A | 11/1998 | Williams | 331/17 |
| 5,841,811 A | 11/1998 | Song | 375/235 |
| 5,844,449 A | 12/1998 | Abeno et al. | 332/105 |
| 5,859,878 A | 1/1999 | Phillips et al. | 375/316 |
| 5,864,754 A | 1/1999 | Hotto | 455/280 |
| 5,870,670 A | 2/1999 | Ripley et al. | |
| 5,872,446 A | 2/1999 | Cranford, Jr. et al. | 323/315 |
| 5,881,375 A | 3/1999 | Bonds | 455/118 |
| 5,883,548 A | 3/1999 | Assard et al. | 329/306 |
| 5,892,380 A | 4/1999 | Quist | 327/172 |
| 5,894,239 A | 4/1999 | Bonaccio et al. | 327/176 |
| 5,894,496 A | 4/1999 | Jones | 455/126 |
| 5,896,562 A | 4/1999 | Heinonen | 455/76 |
| 5,900,747 A | 5/1999 | Brauns | 327/9 |
| 5,901,054 A | 5/1999 | Leu et al. | 363/41 |
| 5,901,187 A | 5/1999 | Iinuma | 375/347 |
| 5,901,344 A | 5/1999 | Opas | 455/76 |
| 5,901,347 A | 5/1999 | Chambers et al. | 455/234.1 |
| 5,901,348 A | 5/1999 | Bang et al. | 455/254 |
| 5,901,349 A | 5/1999 | Guegnaud et al. | 455/302 |
| 5,903,178 A | 5/1999 | Miyatsuji et al. | 327/308 |
| 5,903,187 A | 5/1999 | Claverie et al. | 329/342 |
| 5,903,196 A | 5/1999 | Salvi et al. | 331/16 |
| 5,903,421 A | 5/1999 | Furutani et al. | 361/58 |
| 5,903,553 A | 5/1999 | Sakamoto et al. | 370/338 |
| 5,903,595 A | 5/1999 | Suzuki | 375/207 |
| 5,903,609 A | 5/1999 | Kool et al. | 375/261 |
| 5,903,827 A | 5/1999 | Kennan et al. | 455/326 |
| 5,903,854 A | 5/1999 | Abe et al. | 455/575 |
| 5,905,449 A | 5/1999 | Tsubouchi et al. | 340/925.69 |
| 5,907,149 A | 5/1999 | Marckini | 235/487 |
| 5,907,197 A | 5/1999 | Faulk | 307/119 |
| 5,909,447 A | 6/1999 | Cox et al. | 370/508 |
| 5,911,116 A | 6/1999 | Nosswitz | 455/83 |
| 5,911,123 A | 6/1999 | Shaffer et al. | 455/554 |
| 5,914,622 A | 6/1999 | Inoue | 327/172 |
| 5,915,278 A | 6/1999 | Mallick | 73/658 |
| 5,920,199 A | 7/1999 | Sauer | 329/678 |
| 5,926,065 A | 7/1999 | Wakai et al. | 329/304 |
| 5,933,467 A | 8/1999 | Sehier et al. | 375/350 |
| 5,937,013 A | 8/1999 | Lam et al. | |
| 5,943,370 A | 8/1999 | Smith | 375/334 |
| 5,945,660 A | 8/1999 | Nakasuji et al. | 235/462.46 |
| 5,952,895 A | 9/1999 | McCune, Jr. et al. | 332/128 |
| 5,953,642 A | 9/1999 | Feldtkeller et al. | 455/195.1 |
| 5,959,850 A | 9/1999 | Lim | 363/17 |
| 5,960,033 A | 9/1999 | Shibano et al. | 375/207 |
| 6,014,551 A * | 1/2000 | Pesola et al. | 455/86 |
| 6,028,887 A | 2/2000 | Harrison et al. | 375/206 |
| 6,041,073 A | 3/2000 | Davidovici et al. | 375/148 |
| 6,049,706 A | 4/2000 | Cook et al. | 455/313 |
| 6,054,889 A | 4/2000 | Kobayashi | 327/357 |
| 6,061,551 A | 5/2000 | Sorrells et al. | 455/118 |
| 6,061,555 A | 5/2000 | Bultman et al. | 455/313 |
| 6,073,001 A | 6/2000 | Sokoler | |
| 6,081,691 A | 6/2000 | Renard et al. | 455/12.1 |
| 6,084,922 A | 7/2000 | Zhou et al. | 375/316 |
| 6,085,073 A | 7/2000 | Palermo et al. | |
| 6,091,939 A | 7/2000 | Banh | 455/102 |
| 6,091,940 A | 7/2000 | Sorrells et al. | 455/118 |
| 6,091,941 A | 7/2000 | Moriyama et al. | 455/126 |
| 6,098,886 A | 8/2000 | Swift et al. | 235/472.01 |
| 6,121,819 A | 9/2000 | Traylor | 327/359 |
| 6,125,271 A | 9/2000 | Rowland, Jr. | 455/313 |

| | | | | |
|---|---|---|---|---|
| 6,144,236 A | 11/2000 | Vice et al. ............... 327/113 |
| 6,144,846 A | 11/2000 | Durec ..................... 455/323 |
| 6,147,340 A | 11/2000 | Levy ................... 250/214 R |
| 6,147,763 A | 11/2000 | Steinlechner ............. 356/484 |
| 6,150,890 A | 11/2000 | Damgaard et al. ......... 331/14 |
| 6,175,728 B1 | 1/2001 | Mitama .................. 455/323 |
| 6,215,475 B1 | 4/2001 | Meyerson et al. ......... 345/173 |
| 6,230,000 B1 | 5/2001 | Tayloe |
| 6,266,518 B1 | 7/2001 | Sorrells et al. ........... 455/118 |
| 6,314,279 B1 | 11/2001 | Mohindra |
| 6,330,244 B1 | 12/2001 | Swartz et al. |
| 6,353,735 B1 | 3/2002 | Sorrells et al. ........... 455/118 |
| 6,370,371 B1 | 4/2002 | Sorrells et al. ........... 455/323 |
| 6,400,963 B1 * | 6/2002 | Glockler et al. ........... 455/553 |
| 6,421,534 B1 | 7/2002 | Cook et al. |

FOREIGN PATENT DOCUMENTS

| | | | |
|---|---|---|---|
| DE | 197 35 798 C1 | 7/1998 | .......... H04L/27/00 |
| EP | 0 035 166 A1 | 9/1981 | ........... H04B/1/26 |
| EP | 0 087 336 A1 | 8/1983 | ........... H03D/7/12 |
| EP | 0 099 265 A1 | 1/1984 | ........... H03D/3/04 |
| EP | 0 087 336 B1 | 7/1986 | ........... H03D/7/12 |
| EP | 0 254 844 A2 | 2/1988 | ........... H03D/7/00 |
| EP | 0 276 130 A2 A3 | 7/1988 | ........... H03D/7/00 |
| EP | 0 193 899 B1 | 6/1990 | ............ G01S/7/52 |
| EP | 0 380 351 A2 | 8/1990 | ......... H03H/17/04 |
| EP | 0 380 351 A3 | 2/1991 | ......... H03H/17/04 |
| EP | 0 411 840 A2 | 2/1991 | ........... G01R/33/36 |
| EP | 0 423 718 A2 | 4/1991 | ........... H04N/7/01 |
| EP | 0 411 840 A3 | 7/1991 | ........... G01R/33/36 |
| EP | 0 486 095 A1 | 5/1992 | ........... H03D/3/00 |
| EP | 0 423 718 A3 | 8/1992 | ........... H04N/7/01 |
| EP | 0 512 748 A2 | 11/1992 | ........... H04N/9/64 |
| EP | 0 529 836 A1 | 3/1993 | ........... H03L/7/089 |
| EP | 0 548 542 A1 | 6/1993 | ........... H03B/19/14 |
| EP | 0 512 748 A3 | 7/1993 | ........... H04N/9/64 |
| EP | 0 560 228 A1 | 9/1993 | ........... H03D/7/12 |
| EP | 0 632 288 A2 | 1/1995 | ........... G01S/13/75 |
| EP | 0 632 577 A1 | 1/1995 | ........... H03D/7/16 |
| EP | 0 411 840 B1 | 10/1995 | .......... G01R/33/36 |
| EP | 0 696 854 A1 | 2/1996 | ........... H04B/1/26 |
| EP | 8-139524 | 5/1996 | ........... H03D/7/00 |
| EP | 0 632 288 A3 | 7/1996 | ........... G01S/13/75 |
| EP | 0 732 803 A1 | 9/1996 | ........... H03D/3/00 |
| EP | 0 486 095 B1 | 2/1997 | ........... H03D/3/00 |
| EP | 0 782 275 A2 | 7/1997 | ........... H04B/7/02 |
| EP | 0 785 635 A1 | 7/1997 | ........... H04B/1/713 |
| EP | 0 789 449 A2 | 8/1997 | ........... H03D/7/12 |
| EP | 0 795 978 A2 | 9/1997 | ........... H04L/5/06 |
| EP | 0 795 955 A2 A3 | 9/1997 | .......... H03D/13/00 |
| EP | 0 817 369 A2 A3 | 1/1998 | ........... H03D/7/00 |
| EP | 0 837 565 A1 | 4/1998 | ........... H04B/1/69 |
| EP | 0 862 274 A1 | 9/1998 | ........... H03M/1/06 |
| EP | 0 874 499 A2 | 10/1998 | .......... H04L/25/06 |
| EP | 0 512 748 B1 | 11/1998 | ........... H04N/9/64 |
| FR | 2 245 130 | 4/1975 | ........... H03K/5/13 |
| FR | 2 669 787 A1 | 5/1992 | ........... H03D/7/14 |
| FR | 2 743 231 A1 | 7/1997 | ........... H04B/7/12 |
| GB | 2 161 344 A | 1/1986 | ........... H04B/7/12 |
| GB | 2 215 945 A | 9/1989 | ........... H04L/27/00 |
| GB | 2 324 919 A | 11/1998 | ........... H03D/7/18 |
| JP | 47-2314 | 2/1972 | |
| JP | 55-66057 | 5/1980 | ........... G06K/7/10 |
| JP | 56-114451 | 9/1981 | ........... H04B/7/02 |
| JP | 58-7903 | 1/1983 | ........... H03C/1/02 |
| JP | 58-133004 | 8/1983 | ........... H03D/1/00 |
| JP | 59-144249 | 8/1984 | ........... H04L/27/00 |
| JP | 60-58705 | 4/1985 | ........... H03D/7/00 |
| JP | 60-130203 | 7/1985 | ........... H03D/7/00 |
| JP | 61-30821 | 2/1986 | ........... H04B/1/10 |
| JP | 63-54002 | 3/1988 | ......... H03B/19/114 |
| JP | 63-65587 | 3/1988 | ........... G06K/7/10 |
| JP | 63-153691 | 6/1988 | .......... G06K/17/00 |
| JP | 2-39632 | 2/1990 | ........... H04B/7/12 |
| JP | 2-131629 | 5/1990 | ........... H04B/7/12 |
| JP | 2-276351 | 11/1990 | ........... H04L/27/22 |
| JP | 4-123614 | 4/1992 | ....... H03K/19/0175 |
| JP | 4-127601 | 4/1992 | ........... H03D/7/00 |
| JP | 5-175730 | 7/1993 | ........... H03D/1/00 |
| JP | 5-175734 | 7/1993 | ........... H03D/3/00 |
| JP | 5-327356 | 12/1993 | ........... H03D/7/00 |
| JP | 6-237276 | 8/1994 | ........... H04L/27/20 |
| JP | 7-154344 | 6/1995 | ........... H04B/14/06 |
| JP | 7-307620 | 11/1995 | ........... H03D/1/18 |
| JP | 8-23359 | 1/1996 | ........... H04L/27/20 |
| JP | 8-32556 | 2/1996 | ........... H04L/1/04 |
| WO | WO 80/01633 A1 | 8/1980 | ........... H04J/1/08 |
| WO | WO 91/18445 A1 | 11/1991 | ........... H03D/7/18 |
| WO | WO 94/05087 A1 | 3/1994 | ........... H03M/1/00 |
| WO | WO 95/01006 A1 | 1/1995 | ........... H03M/1/66 |
| WO | WO 96/02977 A1 | 2/1996 | ........... H04B/1/26 |
| WO | WO 96/08078 A1 | 3/1996 | ........... H03D/3/00 |
| WO | WO 96/39750 A1 | 12/1996 | ........... H04B/1/26 |
| WO | WO 97/08839 A2 A3 | 3/1997 | ........... H04B/1/04 |
| WO | WO 97/38490 A1 | 10/1997 | ........... H03K/7/00 |
| WO | WO 98/00953 A1 | 1/1998 | ........... H04L/27/26 |
| WO | WO 98/24201 A1 | 6/1998 | ........... H04H/1/00 |
| WO | WO 98/40968 A2 A3 | 9/1998 | ........... H03L/7/08 |
| WO | WO 99/23755 A1 | 5/1999 | ........... H03D/7/16 |

OTHER PUBLICATIONS

Ritter, G.M., "SDA, A New Solution for Transceivers," *16th European Microwave Conference*, Microwave Exhibitions and Publishers, pp. 729–733 (Sep. 8, 1986).

DIALOG File 351 (Derwent WPI) English Language Patent Abstract for FR 2 669 787, 1 page (May 29, 1992–Date of publication of application).

U.S. patent application Ser. No. 09/569,044, Sorrells et al., filed May 10, 2000.

U.S. patent application Ser. No. 09/569,045, Sorrells et al., filed May 10, 2000.

Akos, D.M. et al., "Direct Bandpass Sampling of Multiple Distinct RF Signals," *IEEE Transactions on Communications*, IEEE, vol. 47, No. 7, pp. 983–988 (Jul. 1999).

Patel, M. et al., "Bandpass Sampling for Software Radio Receivers, and the Effect of Oversampling on Aperture Jitter," *VTC 2002*, IEEE, pp. 1901–1905 (2002).

English–language Abstract of Japanese Patent Publication No. 61–030821, 1 page (Feb. 13, 1986– Date of publication of application).

English–language Abstract of Japanese Patent Publication No. 05–327356, 1 page (Dec. 10, 1993—Date of publication of application).

Aghvami, H. et al., "Land Mobile Satellites Using the Highly Elliptic Orbits– The UK T–SAT Mobile Payload," *Fourth International Conference on Satellite Systems for Mobile Communications and Navigation*, IEE, pp. 147–153 (Oct. 17–19, 1988).

Akers, N.P. et al., "RF Sampling Gates: a Brief Review," *IEE Proceedings*, IEE, vol. 133, Part A, No. 1, pp. 45–49 (Jan. 1986).

Al–Ahmad, H.A.M. et al., "Doppler Frequency Correction for a Non–Geostationary Communications Satellite. Techniques for CERS and T–SAT," *Electronics Division Colloquium on Low Noise Oscillators and Synthesizers*, IEE, pp. 4/1–4/5 (Jan. 23, 1986).

Ali, I. et al., "Doppler Characterization for LEO Satellites," *IEEE Transactions on Communications*, IEEE, vol. 46, No. 3, pp. 309–313 (Mar. 1998).

Allan, D.W., "Statistics of Atomic Frequency Standards," *Proceedings Of The IEEE Special Issue on Frequency Stability*, IEEE, pp. 221–230 (Feb. 1966).

Allstot, D.J. et al., "MOS Switched Capacitor Ladder Filters," *IEEE Journal of Solid–State Circuits*, IEEE, vol. SC–13, No. 6, pp. 806–814 (Dec. 1978).

Allstot, D.J. and Black Jr. W.C., "Technological Design Considerations for Monolithic MOS Switched–Capacitor Filtering Systems," *Proceedings of the IEEE*, IEEE, vol. 71, No. 8, pp. 967–986 (Aug. 1983).

Alouini, M. et al., "Channel Characterization and Modeling for Ka–Band Very Small Aperture Terminals," *Proceedings Of the IEEE*, IEEE, vol. 85, No. 6, pp. 981–997 (Jun. 1997).

Andreyev, G.A. and Ogarev, S.A., "Phase Distortions of Keyed Millimeter–Wave Signals in the Case of Propagation in a Turbulent Atmosphere," *Telecommunications and Radio Engineering*, Scripta Technica, vol. 43, No. 12, pp. 87–90 (Dec. 1988).

Antonetti, A. et al., "Optoelectronic Sampling in the Picosecond Range," *Optics Communications*, North–Holland Publishing Company, vol. 21, No. 2, pp. 211–214 (May 1977).

Austin, J. et al., "Doppler Correction of the Telecommunication Payload Oscillators in the UK T–Sat," *18th European Microwave Conference*, Microwave Exhibitions and Publishers Ltd., pp. 851–857 (Sep. 12–15, 1988).

Auston, D.H., "Picosecond optoelectronic switching and gating in silicon," *Applied Physics Letters*, American Institute of Physics, vol. 26, No. 3, pp. 101–103 (Feb. 1, 1975).

Baher, H., "Transfer Functions for Switched–Capacitor and Wave Digital Filters," *IEEE Transactions on Circuits and Systems*, IEEE Circuits and Systems Society, vol. CAS–33, No. 11, pp. 1138–1142 (Nov. 1986).

Baines, R., "The DSP Bottleneck," *IEEE Communications Magazine*, IEEE Communications Society, pp. 46–54 (May 1995).

Banjo, O.P. and Vilar, E., "Binary Error Probabilities on Earth–Space Links Subject to Scintillation Fading," *Electronics Letters*, IEE, vol. 21, No. 7, pp. 296–297 (Mar. 28, 1985).

Banjo, O.P. and Vilar, E., "The Dependence of Slant Path Amplitude Scintillations on Various Meteorological Parameters," *Fifth International Conference on Antennas and Propagation (ICAP 87) Part 2: Propagation*, IEE, pp. 277–280 (Mar. 30—Apr. 2, 1987).

Banjo, O.P. and Vilar, E. "Measurement and Modeling of Amplitude Scintillations on Low–Elevation Earth–Space Paths and Impact on Communication Systems," *IEEE Transactions on Communications*, IEEE Communications Society, vol. COM–34, No. 8, pp. 774–780 (Aug. 1986).

Banjo, O.P. et al., "Tropospheric Amplitude Spectra Due to Absorption and Scattering in Earth–Space Paths," *Fourth International Conference on Antennas and Propagation (ICAP 85)*, IEE, pp. 77–82 (Apr. 16–19, 1985).

Basili,P. et al., "Case Study of Intense Scintillation Events on the OTS Path," *IEEE Transactions on Antennas and Propagation*, IEEE, vol. 38, No. 1, pp. 107–113 (Jan. 1990).

Basili, P. et al., "Observation of High $C^2$ and Turbulent Path Length on OTS Space–Earth Link," *Electronics Letters*, IEE, vol. 24, No. 17, pp. 1114–1116 (Aug. 18, 1988).

Blakey, J.R. et al., "Measurement of Atmospheric Millimetre–Wave Phase Scintillations in an Absorption Region," *Electronics Letters*, IEE, vol. 21, No. 11, pp. 486–487 (May 23, 1985).

Burgueño, A. et al., "Influence of rain gauge integration time on the rain rate statistics used in microwave communications," *annales des télècommunications*, International Union of Radio Science, pp. 522–527 (Sep./Oct. 1988).

Burgueño, A. et al., "Long–Term Joint Statistical Analysis of Duration and Intensity of Rainfall Rate with Application to Microwave Communications," *Fifth International Conference on Antennas and Propagation (ICAP 87) Part 2: Propagation*, IEE, pp. 198–201 (Mar. 30–Apr. 2, 1987).

Burgueño, A. et al., "Long Term Statistics of Precipitation Rate Return Periods in the Context of Microwave Communications," *Sixth International Conference on Antennas and Propagation (ICAP 89) Part 2: Propagation*, IEE, pp. 297–301 (Apr. 4–7, 1989).

Burgueño, A. et al., "Spectral Analysis of 49 Years of Rainfall Rate and Relation to Fade Dynamics," *IEEE Transactions on Communications*, IEEE Communications Society, vol. 38, No. 9, pp. 1359–1366 (Sep. 1990).

Catalan, C. and Vilar, E., "Approach for satellite slant path remote sensing," *Electronics Letters*, IEE, vol. 34, No. 12, pp. 1238–1240 (Jun. 11, 1998).

Chan, P. et al., "A Highly Linear 1–GHz CMOS Downconversion Mixer," *European Solid State Circuits Conference*, IEEE Communications Society, pp. 210–213 (Sep. 22–24, 1993).

Copy of Declaration of Michael J. Bultman filed in patent application Ser. No. 09/176,022, which is directed to related subject matter, 2 pages.

Copy of Declaration of Robert W. Cook filed in patent application Ser. No. 09/176,022, which is directed to related subject matter, 2 pages.

Copy of Declaration of Alex Holtz filed in patent application Ser. No. 09/176,022, which is directed to related subject matter, 3 pages.

Copy of Declaration of Richard C. Looke filed in patent application Ser. No. 09/176,022, which is directed to related subject matter, 2 pages.

Copy of Declaration of Charley D. Moses, Jr. filed in patent application Ser. No. 09/176,022, which is directed to related subject matter, 2 pages.

Copy of Declaration of Jeffrey L. Parker and David F. Sorrells, with attachment Exhibit 1, filed in patent application Ser. No. 09/176,022, which is directed to related subject matter, 130 pages.

Dewey, R.J. and Collier, C.J., "Multi–Mode Radio Receiver," *Electronics Division Colloquium on Digitally Implemented Radios*, IEE, pp. 3/1–3/5 (Oct. 18, 1985).

DIALOG File 347 (JAPIO) English Language Patent Abstract for JP 2–276351, 1 page (Nov. 13, 1990—Date of publication of application).

DIALOG File 347 (JAPIO) English Language Patent Abstract for JP 2–131629, 1 page (May 21, 1990—Date of publication of application).

DIALOG File 347 (JAPIO) English Language Patent Abstract for JP 2–39632, 1 page (Feb. 8, 1990—Date of publication of application).

DIALOG File 348 (European Patents) English Language Patent Abstract for EP 0 785 635 A1, 3 pages (Dec. 26, 1996—Date of publication of application).

DIALOG File 348 (European Patents) English Language Patent Abstract for EP 35166 A1, 2 pages (Feb. 18, 1981—Date of publication of application).

"DSO takes sampling rate to 1 Ghz," *Electronic Engineering*, Morgan Grampian Publishers, vol. 59, No. 723, pp. 77 and 79 (Mar. 1987).

Erdi, G. and Henneuse, P.R., "A Precision FET–Less Sample–and–Hold with High Charge–to–Droop Current Ratio," *IEEE Journal of Solid–State Circuits*, IEEE, vol. SC–13, No. 6, pp. 864–873 (Dec. 1978).

Faulkner, N.D. and Vilar, E., "Subharmonic Sampling for the Measurement of Short Term Stability of Microwave Oscillators," *IEEE Transactions on Instrumentation and Measurement*, IEEE, vol. IM–32, No. 1, pp. 208–213 (Mar. 1983).

Faulkner, N.D. et al., "Sub–Harmonic Sampling for the Accurate Measurement of Frequency Stability of Microwave Oscillators," *CPEM 82 Digest: Conference on Precision Electromagnetic Measurements*, IEEE, pp. M–10 and M–11 (1982).

Faulkner, N.D. and Vilar, E., "Time Domain Analysis of Frequency Stability Using Non–Zero Dead–Time Counter Techniques," *CPEM 84 Digest Conference on Precision Electromagnetic Measurements*, IEEE, pp. 81–82 (1984).

Filip, M. and Vilar, E., "Optimum Utilization of the Channel Capacity of a Satellite Link in the Presence of Amplitude Scintillations and Rain Attenuation," *IEEE Transactions on Communications*, IEEE Communications Society, vol. 38, No. 11, pp. 1958–1965 (Nov. 1990).

Fukahori, K., "A CMOS Narrow–Band Signaling Filter with Q Reduction," *IEEE Journal of Solid–State Circuits*, IEEE, vol. SC–19, No. 6, pp. 926–932 (Dec. 1984).

Fukuchi, H. and Otsu, Y., "Available time statistics of rain attenuation on earth–space path," *IEE Proceedings–H: Microwaves, Antennas and Propagation*, IEE, vol. 135, Pt. H, No. 6, pp. 387–390 (Dec. 1988).

Gibbins, C.J. and Chadha, R., "Millimetre–wave propagation through hydrocarbon flame," *IEE Proceedings*, IEE, vol. 134, Pt. H, No. 2, pp. 169–173 (Apr. 1987).

Gilchrist, B. et al., "Sampling hikes performance of frequency synthesizers," *Microwaves & RF*, Hayden Publishing, vol. 23, No. 1, pp. 93–94 and 110 (Jan. 1984).

Gossard, E.E., "Clear weather meterological effects on propagation at frequencies above 1 Ghz," *Radio Science*, American Geophysical Union, vol. 16, No. 5, pp. 589–608 (Sep.—Oct. 1981).

Gregorian, R. et al., "Switched–Capacitor Circuit Design," *Proceedings of the IEEE*, IEEE, vol. 71, No. 8, pp. 941–966 (Aug. 1983).

Groshong et al., "Undersampling Techniques Simplify Digital Radio," *Electronic Design*, Penton Publishing, pp. 67–68, 70, 73–75 and 78 (May 23, 1991).

Grove, W.M., "Sampling for Oscilloscopes and Other RF Systems: Dc through X–Band," *IEEE Transactions on Microwave Theory and Techniques*, IEEE, pp. 629–635 (Dec. 1966).

Haddon, J. et al., "Measurement of Microwave Scintillations on a Satellite Down–Link at X–Band," *Antennas and Propagation*, IEE, pp. 113–117 (1981).

Haddon, J. and Vilar, E., "Scattering Induced Microwave Scintillations from Clear Air and Rain on Earth Space Paths and the Influence of Antenna Aperture," *IEEE Transactions on Antennas and Propagation*, IEEE, vol. AP–34, No. 5, pp. 646–657 (May 1986).

Hafdallah, H. et al., "2–4 Ghz MESFET Sampler," *Electronics Letters*, IEE, vol. 24, No. 3, pp. 151–153 (Feb. 4, 1988).

Herben, M.H.A.J., "Amplitude and Phase Scintillation Measurements on 8–2 km Line–Of–Sight Path at 30 Ghz," *Electronics Letters*, IEE, vol. 18, No. 7, pp. 287–289 (Apr. 1, 1982).

Hewitt, A. et al., "An 18 Ghz Wideband LOS Multipath Experiment," *International Conference on Measurements for Telecommunications Transmission Systems—MTTS 85*, IEE, pp. 112–116 (Nov. 27–28, 1985).

Hewitt, A. et al., "An Autoregressive Approach to the Identification of Multipath Ray Parameters from Field Measurements," *IEEE Transactions on Communications*, IEEE Communications, Society, vol. 37, No. 11, pp. 1136–1143 (Nov. 1989).

Hewitt, A. and Vilar, E., "Selective fading on LOS Microwave Links: Classical and Spread–Spectrum Measurement Techniques," *IEEE Transactions on Communications*, IEEE Communications Society, vol. 36, No. 7, pp. 789–796 (Jul. 1988).

Hospitalier, E., "Instruments for Recording and Observing Rapidly Varying Phenomena," *Science Abstracts*, IEE, vol. VII, pp. 22–23 (1904).

Howard, I.M. and Swansson, N.S., "Demodulating High Frequency Resonance Signals for Bearing Fault Detection," *The Institution of Engineers Australia Vibration and Noise Conference*, Institution of Engineers, Australia, pp. 115–121 (Sep. 18–20, 1990).

Hu, X., *A Switched–Current Sample–and–Hold Amplifier for FM Demodulation*, Thesis for Master of Applied Science, Dept. of Electrical and Computer Engineering, University of Toronto, UMI Dissertation Services, pp. 1–64 (1995).

Hung, H–L. A. et al., "Characterization of Microwave Integrated Circuits Using An Optical Phase–Locking and Sampling System," *IEEE MTT–S Digest*, IEEE, pp. 507–510 (1991).

Hurst, P.J., "Shifting the Frequency Response of Switched–Capacitor Filters by Nonuniform Sampling," *IEEE Transactions on Circuits and Systems*, IEEE Circuits and Systems Society, vol. 38, No. 1, pp. 12–19 (Jan. 1991).

Itakura, T., "Effects of the sampling pulse width on the frequency characteristics of a sample–and–hold circuit," *IEE Proceedings Circuits, Devices and Systems*, IEE, vol. 141, No. 4, pp. 328–336 (Aug. 1994).

Janssen, J.M.L., "An Experimental 'Stroboscopic' Oscilloscope for Frequencies up to about 50 Mc/s: I. Fundamentals," *Philips Technical Review*, Philips Research Laboratories, vol. 12, No. 2, pp. 52–59 (Aug. 1950).

Janssen, J.M.L. and Michels, A.J., "An Experimental 'Stroboscopic' Oscilloscope for Frequencies up to about 50 Mc/s: II. Electrical Build–Up," *Phillips Technical Review*, Philips Reserch Laboratories, vol. 12, No. 3, pp. 73–82 (Sep. 1950).

Jondral, V.F. et al., "Doppler Profiles for Communication Satellites," *Frequenz*, Herausberger, pp. 111–116 (May–Jun. 1996).

Kaleh, G.K., "A Frequency Diversity Spread Spectrum System for Communication in the Presence of In–Band Interference," *1995 IEEE Globecom*, IEEE Communications Society, pp. 66–70 (1995).

Karasawa, Y. et al., "A New Prediction Method for Tropospheric Scintillation in Earth–Space Paths," *IEEE Transactions on Antennas and Propagation*, IEEE Antennas and Propagation Society, vol. 36, No. 11, pp. 1608–1614 (Nov. 1988).

Kirsten, J. and Fleming, J., "Undersampling reduces data–acquisition costs for select applications," *EDN*, Cahners Publishing, vol. 35, No. 13, pp. 217–222, 224, 226–228 (Jun. 21, 1990).

Lam, W.K. et al., "Measurement of the Phase Noise Characteristics of an Unlocked Communications Channel Identifier," *Proceedings Of the 1993 IEEE International Frequency Control Symposium*, IEEE, pp. 282–288 (Jun. 2–4, 1993).

Lam, W.K. et al., "Wideband sounding of 11.6 Ghz transhorizon channel," *Electronics Letters*, IEE, vol. 30, No. 9, pp. 738–739 (Apr. 28, 1994).

Larkin, K.G., "Efficient demodulator for bandpass sampled AM signals," *Electronics Letters*, IEE, vol. 32, No. 2, pp. 101–102 (Jan. 18, 1996).

Lau, W.H. et al., "Analysis of the Time Variant Structure of Microwave Line–of–sight Multipath Phenomena," *IEEE Global Telecommunications Conference & Exhibition*, IEEE, pp. 1707–1711 (Nov. 28—Dec. 1, 1988).

Lau, W.H. et al., "Improved Prony Algorithm to Identify Multipath Components," *Electronics Letters*, IEE, vol. 23, No. 20, pp. 1059–1060 (Sep. 24, 1987).

Lesage, P. and Audoin, C., "Effect of Dead–Time on the Estimation of the Two–Sample Variance," *IEEE Transactions on Instrumentation and Measurement*, IEEE Instrumentation and Measurement Society, vol. IM–28, No. 1, pp. 6–10 (Mar. 1979).

Liechti, C.A., "Performance of Dual–gate GaAs MESFET's as Gain–Controlled Low–Noise Amplifiers and High–Speed Modulators," *IEEE Transactions on Microwave Theory and Techniques*, IEEE Microwave Theory and Techniques Society, vol. MTT–23, No. 6, pp. 461–469 (Jun. 1975).

Linnenbrink, T.E. et al., "A One Gigasample Per Second Transient Recorder," *IEEE Transactions on Nuclear Science*, IEEE Nuclear and Plasma Sciences Society, vol. NS–26, No. 4, pp. 4443–4449 (Aug. 1979).

Liou, M.L., "A Tutorial on Computer–Aided Analysis of Switched–Capacitor Circuits," *Proceedings of the IEEE*, IEEE, vol. 71, No. 8, pp. 987–1005 (Aug. 1983).

Lo, P. et al., "Coherent Automatic Gain Control," *IEE Colloquium on Phase Locked Techniques*, IEE, pp. 2/1–2/6 (Mar. 26, 1980).

Lo, P. et al., "Computation of Rain Induced Scintillations on Satellite Down–Links at Microwave Frequencies," *Third International Conference on Antennas and Propagation (ICAP 83)*, pp. 127–131 (Apr. 12–15, 1983).

Lo, P.S.L.O. et al., "Observations of Amplitude Scintillations on a Low–Elevation Earth–Space Path," *Electronics Letters*, IEE, vol. 20, No. 7, pp. 307–308 (Mar. 29, 1984).

Madani, K. and Aithison, C.S., "A 20 Ghz Microwave Sampler," *IEEE Transactions on Microwave Theory and Techniques*, IEEE Microwave Theory and Technique Society, vol. 40, No. 10, pp. 1960–1963 (Oct. 1992).

Marsland, R.A. et al., "130Ghz GaAs monolithic integrated circuit sampling head," *Appl. Phys. Lett.*, American Institute of Physics, vol. 55, No. 6, pp. 592–594 (Aug. 7, 1989).

Martin, K. and Sedra, A.S., "Switched–Capacitor Building Blocks for Adaptive Systems," *IEEE Transactions on Circuits and Systems*, IEEE Circuits and Systems Society, vol. CAS–28, No. 6, pp. 576–584 (Jun. 1981).

Marzano, F.S. and d'Auria, G., "Model–based Prediction of Amplitude Scintillation variance due to Clear–Air Tropospheric Turbulence on Earth–Satellite Microwave Links," *IEEE Transactions on Antennas and Propagation*, IEEE Antennas and Propagation Society, vol. 46, No. 10, pp. 1506–1518 (Oct. 1998).

Matricciani, E., "Prediction of fade durations due to rain in satellite communications systems," *Radio Science*, American Geophysical Union, vol. 32, No. 3, pp. 935–941 (May–Jun. 1997).

McQueen, J.G., "The Monitoring of High–Speed Waveforms," *Electronic Engineering*, Morgan Brothers Limited, vol. XXIV, No. 296, pp. 436–441 (Oct. 1952).

Merkelo, J. and Hall, R.D., "Broad–Band Thin–Film Signal Sampler," *IEEE Journal of Solid–State Circuits*, IEEE, vol. SC–7, No. 1, pp. 50–54 (Feb. 1972).

Merlo, U. et al., "Amplitude Scintillation Cycles in a Sirio Satellite–Earth Link," *Electronic Letters*, IEE, vol. 21, No. 23, pp. 1094–1096 (Nov. 7, 1985).

Morris, D., "Radio–holographic reflector measurement of the 30–m millimeter radio telescope at 22 Ghz with a cosmic signal source," *Astronomy and Astrophysics*, Springer–Verlag, vol. 203, No. 2, pp. 399–406 (Sep. (II) 1988).

Moulsley, T.J. et al., "The efficient acquisition and processing of propagation statistics," *Journal of the Institution of Electronic and Radio Engineers*, IERE, vol. 55, No. 3, pp. 97–103 (Mar. 1985).

Ndzi, D. et al., "Wide–Band Statistical Characterization of an Over–the–Sea Experimental Transhorizon Link," *IEE Colloquium on Radio Communications at Microwave and Millimetre Wave Frequencies*, IEE, pp. 1/1–1/6 (Dec. 16, 1996).

Ndzi, D. et al., "Wideband Statistics of Signal Levels and Doppler Spread on an Over–The–Sea Transhorizon Link," *IEE Colloquium on Propagation Characteristics and Related System Techniques for Beyond Line–of–Sight Radio*, IEE, pp. 9/1–9/6 (Nov. 24, 1997).

"New zero IF chipset from Philips," *Electronic Engineering*, United News & Media, vol. 67, No. 825, p. 10 (Sep. 1995).

Ohara, H. et al., "First monolithic PCM filter cuts cost of telecomm systems," *Electronic Design*, Hayden Publishing Company, vol. 27, No. 8, pp. 130–135 (Apr. 12, 1979).

Oppenheim, A.V. et al., *Signals and Systems*, Prentice–Hall, pp.527–531 and 561–562 (1983).

Ortgies, G., "Experimental Parameters Affecting Amplitude Scintillation Measurements on Satellite Links," *Electronics Letters*, IEE, vol. 21, No. 17, pp. 771–772 (Aug. 15, 1985).

Pärssinen et al., "A 2–GHz Subharmonic Sampler for Signal Downconversion," *IEEE Transactions on Microwave Theory and Techniques*, IEEE, vol. 45, No. 12, 7 pages (Dec. 1997).

Peeters, G. et al., "Evaluation of Statistical Models for Clear–Air Scintillation Prediction Using Olympus Satellite Measurements," *International Journal of Satellite Communications*, John Wiley and Sons, vol. 15, No. 2, pp. 73–88 (Mar.–Apr. 1997).

Perrey, A.G. and Schoenwetter, H.K., *NBS Technical Note 1121: A Schottky Diode Bridge Sampling Gate*, U.S. Dept. of Commerce, pp. 1–14 (May 1980).

Poulton, K. et al., "A 1–Ghz 6–bit ADC System," *IEEE Journal of Solid–State Circuits*, IEEE, vol. SC–22, No. 6, pp. 962–969 (Dec. 1987).

Press Release, "Parkervision, Inc. Announces Fiscal 1993 Results," Lippert/Heilshorn and Associates, 2 pages (Apr. 6, 1994).

Press Release, "Parkervision, Inc. Announces the Appointment of Michael Baker to the New Position of National Sales Manager," Lippert/Heilshorn and Associates, 1 page (Apr. 7, 1994).

Press Release, "Parkervision's Cameraman Well–Received By Distance Learning Market," Lippert/Heilshorn and Associates, 2 pages (Apr. 8, 1994).

Press Release, "Parkervision, Inc. Announces First Quarter Financial Results," Lippert/Heilshorn and Associates, 2 pages (Apr. 26, 1994).

Press Release, "Parkervision, Inc. Announces The Retirement of William H. Fletcher, Chief Financial Officer," Lippert/Heilshorn and Associates, 1 page (May 11, 1994).

Press Release, "Parkervision, Inc. Announces New Cameraman System II™ At Infocomm Trade Show," Lippert/Heilshorn and Associates, 3 pages (Jun. 9, 1994).

Press Release, "Parkervision, Inc. Announces Appointments to its National Sales Force," Lippert/Heilshorn and Associates, 2 pages (Jun. 17, 1994).

Press Release, "Parkervision, Inc. Announces Second Quarter and Six Months Financial Results," Lippert/Heilshorn and Associates, 3 pages (Aug. 9, 1994).

Press Release, "Parkervision, Inc. Announces Third Quarter and Nine Months Financial Results," Lippert/Heilshorn and Associates, 3 pages (Oct. 28, 1994).

Press Release, "Parkervision, Inc. Announces First Significant Dealer Sale of Its *Cameraman*® System II," Lippert/Heilshorn and Associates, 2 pages (Nov. 7, 1994).

Press Release, "Parkervision, Inc. Announces Fourth Quarter and Year End Results," Lippert/Heilshorn and Associates, 2 pages (Mar. 1, 1995).

Press Release, "Parkervision, Inc. Announces Joint Product Developments With VTEL," Lippert/Heilshorn and Associates, 2 pages (Mar. 21, 1995).

Press Release, "Parkervision, Inc. Announces First Quarter Financial Results," Lippert/Heilshorn and Associates, 3 pages (Apr. 28, 1995).

Press Release, "Parkervision Wins Top 100 Product Districts' Choice Award," Parkervision Marketing and Manufacturing Headquarters, 1 page (Jun. 29, 1995).

Press Release, "Parkervision National Sales Manager Next President of USDLA," Parkervision Marketing and Manufacturing Headquarters, 1 page (Jul. 6, 1995).

Press Release, "Parkervision Granted New Patent," Parkervision Marketing and Manufacturing Headquarters, 1 page (Jul. 21, 1995).

Press Release, "Parkervision, Inc. Announces Second Quarter and Six Months Financial Results," Parkervision Marketing and Manufacturing Headquarters, 2 pages (Jul. 31, 1995).

Press Release, "Parkervision, Inc. Expands Its Cameraman System II Product Line," Parkervision Marketing and Manufacturing Headquarters, 2 pages (Sep. 22, 1995).

Press Release, "Parkervision Announces New Camera Control Technology," Parkervision Marketing and Manufacturing Headquarters, 2 pages (Oct. 25, 1995).

Press Release, "Parkervision, Inc. Announces Completion of VTEL/Parkervision Joint Product Line," Parkervision Marketing and Manufacturing Headquarters, 2 pages (Oct. 20, 1995).

Press Release, "Parkervision, Inc. Announces Third Quarter and Nine Months Financial Results," Parkervision Marketing and Manufacturing Headquarters, 2 pages (Oct. 30, 1995).

Press Release, "Parkervision's Cameraman Personal Locator Camera System Wins Telecon XV Award," Parkervision Marketing and Manufacturing Headquarters, 2 pages (Nov. 1, 1995).

Press Release, "Parkervision, Inc. Announces Purchase Commitment From VTEL Corporation," Parkervision Marketing and Manufacturing Headquarters, 1 page (Feb. 26, 1996).

Press Release, "ParkerVision, Inc. Announces Fourth Quarter and Year End Results," Parkervision Marketing and Manufacturing Headquarters, 2 pages (Feb. 27, 1996).

Press Release, "ParkerVision, Inc. Expands its Product Line," Parkervision Marketing and Manufacturing Headquarters, 2 pages (Mar. 7, 1996).

Press Release, "ParkerVision Files Patents for its Research of Wireless Technology," Parkervision Marketing and Manufacturing Headquarters, 1 page (Mar. 28, 1996).

Press Release, "Parkervision, Inc. Announces First Significant Sale of Its Cameraman® Three–Chip System," Parkervision Marketing and Manufacturing Headquarters, 2 pages (Apr. 12, 1996).

Press Release, "Parkervision, Inc. Introduces New Product Line For Studio Production Market," Parkervision Marketing and Manufacturing Headquarters, 2 pages (Apr. 15, 1996).

Press Release, "Parkervision, Inc. Announces Private Placement of 800,000 Shares," Parkervision Marketing and Manufacturing Headquarters, 1 page (Apr. 15, 1996).

Press Release, "Parkervision, Inc. Announces First Quarter Financial Results," Parkervision Marketing and Manufacturing Headquarters, 3 pages (Apr. 30, 1996).

Press Release, "ParkerVision's New Studio Product Wins Award," Parkervision Marketing and Manufacturing Headquarters, 2 pages (Jun. 5, 1996).

Press Release, "Parkervision, Inc. Announces Second Quarter and Six Months Financial Results," Parkervision Marketing and Manufacturing Headquarters, 3 pages (Aug. 1, 1996).

Press Release, "Parkervision, Inc. Announces Third Quarter and Nine Months Financial Results," Parkervision Marketing and Manufacturing Headquarters, 2 pages (Oct. 29, 1996).

Press Release, "PictureTel and ParkerVision Sign Reseller Agreement," Parkervision Marketing and Manufacturing Headquarters, 2 pages (Oct. 30, 1996).

Press Release, "CLI and ParkerVision Bring Enhanced Ease–of–Use to Videoconferencing," CLI/Parkervision, 2 pages (Jan. 20, 1997).

Press Release, "Parkervision, Inc. Announces Fourth Quarter and Year End Results," Parkervision Marketing and Manufacturing Headquarters, 3 pages (Feb. 27, 1997).

Press Release, "Parkervision, Inc. Announces First Quarter Financial Results," Parkervision Marketing and Manufacturing Headquarters, 3 pages (Apr. 29, 1997).

Press Release, "NEC and Parkervision Make Distance Learning Closer," NEC America, 2 pages (Jun. 18, 1997).

Press Release, "Parkervision Supplies JPL with Robotic Cameras, Cameraman Shot Director for Mars Mission," Parkervision Marketing and Manufacturing Headquarters, 2 pages (Jul. 8, 1997).

Press Release, "ParkerVision and IBM Join Forces to Create Wireless Computer Peripherals," Parkervision Marketing and Manufacturing Headquarters, 2 pages (Jul. 23, 1997).

Press Release, "ParkerVision, Inc. Announces Second Quarter and Six Months Financial Results," Parkervision Marketing and Manufacturing Headquarters, 3 pages (Jul. 31, 1997).

Press Release, "Parkervision, Inc. Announces Private Placement of 990,000 Shares," Parkervision Marketing and Manufacturing Headquarters, 2 pages (Sep. 8, 1997).

Press Release, "Wal–Mart Chooses Parkervision for Broadcast Production," Parkervision Marketing and Manufacturing Headquarters, 2 pages (Oct. 24, 1997).

Press Release, "Parkervision, Inc. Announces Third Quarter Financial Results," Parkervision Marketing and Manufacturing Headquarters, 3 pages (Oct. 30, 1997).

Press Release, "ParkerVision Announces Breakthrough in Wireless Radio Frequency Technology," Parkervision Marketing and Manufacturing Headquarters, 3 pages (Dec. 10, 1997).

Press Release, "Parkervision, Inc. Announces the Appointment of Joseph F. Skovron to the Position of Vice President, Licensing—Wireless Technologies," Parkervision Marketing and Manufacturing Headquarters, 2 pages (Jan. 9, 1998).

Press Release, "Parkervision Announces Existing Agreement with IBM Terminates—Company Continues with Strategic Focus Announced in Dec.," Parkervision Marketing and Manufacturing Headquarters, 2 pages (Jan. 27, 1998).

Press Release, "Laboratory Tests Verify Parkervision Wireless Technology," Parkervision Marketing and Manufacturing Headquarters, 2 pages (Mar. 3, 1998).

Press Release, "Parkervision, Inc. Announces Fourth Quarter and Year End Financial Results," Parkervision Marketing and Manufacturing Headquarters, 3 pages (Mar. 5, 1998).

Press Release, "Parkervision Awarded Editors' Pick of Show for NAB 98," Parkervision Marketing and Manufacturing Headquarters, 2 pages (Apr. 15, 1998).

Press Release, "Parkervision Announces First Quarter Financial Results," Parkervision Marketing and Manufacturing Headquarters, 3 pages (May 4, 1998).

Press Release, "Parkervision 'DIRECT2DATA' Introduced in Response to Market Demand," Parkervision Marketing and Manufacturing Headquarters, 3 pages (Jul. 9, 1998).

Press Release, "Parkervision Expands Senior Management Team," Parkervision Marketing and Manufacturing Headquarters, 2 pages (Jul. 29, 1998).

Press Release, "Parkervision Announces Second Quarter and Six Month Financial Results," Parkervision Marketing and Manufacturing Headquarters, 4 pages (Jul. 30, 1998).

Press Release, "Parkervision Announces Third Quarter and Nine Month Financial Results," Parkervision Marketing and Manufacturing Headquarters, 3 pages (Oct. 30, 1998).

Press Release, "Questar Infocomm, Inc. Invests $5 Million in Parkervision Common Stock," Parkervision Marketing and Manufacturing Headquarters, 3 pages (Dec. 2, 1998).

Press Release, "Parkervision Adds Two New Directors," Parkervision Marketing and Manufacturing Headquarters, 2 pages (Mar. 5, 1999).

Press Release, "Parkervision Announces Fourth Quarter and Year End Financial Results," Parkervision Marketing and Manufacturing Headquarters, 3 pages (Mar. 5, 1999).

Press Release, "Joint Marketing Agreement Offers New Automated Production Solution," Parkervision Marketing and Manufacturing Headquarters, 2 pages (Apr. 13, 1999).

"Projected COST 205: Scintillations in Earth–satellite links," *Alta Frequenza: Scientific Review in Electronics*, AEI, vol. LIV, No. 3, pp. 209–211 (May–Jun., 1985).

Razavi, B., *RE Microelectronics*, Prentice–Hall, pp. 147–149 (1998).

Reeves, R.J.D., "The Recording and Collocation of Waveforms (Part 1)," *Electronic Engineering*, Morgan Brothers Limited, vol. 31, No. 373, pp. 130–137 (Mar. 1959).

Reeves, R.J.D., "The Recording and Collocation of Waveforms (Part 2)," *Electronic Engineering*, Morgan Brothers Limited, vol. 31, No. 374, pp. 204–212 (Apr. 1959).

Rein, H.M. and Zahn, M., "Subnanosecond–Pulse Generator with Variable Pulsewidth Using Avalanche Transistors," *Electronics Letters*, IEE, vol. 11, No. 1, pp. 21–23 (Jan. 9, 1975).

Riad, S.M. and Nahman, N.S., "Modeling of the Feed–through Wideband (DC to 12.4 Ghz) Sampling–Head," *IEEE MTT–S International Microwave Symposium Digest*, IEEE, pp. 267–269 (Jun. 27–29, 1978).

Rizzoli, V. et al., "Computer–Aided Noise Analysis of MESFET and HEMT Mixers," *IEEE Transactions on Microwave Theory and Techniques*, IEEE, vol. 37, No. 9, pp. 1401–1410 (Sep. 1989).

Rowe, H.E., *Signals and Noise in Communication Systems*, D. Van Nostrand Company, Inc., Princeton, New Jersey, including, for example, Chapter V, Pulse Modulation Systems (1965).

Rücker, F. and Dintelmann, F., "Effect of Antenna Size on OTS Signal Scintillations and Their Seasonal Dependence," *Electronics Letters*, IEEE, vol. 19, No. 24, pp. 1032–1034 (Nov. 24, 1983).

Russell, R. and Hoare, L., "Millimeter Wave Phase Locked Oscillators," *Military Microwave '78 Conference Proceedings*, Microwave Exhibition and Publishers, pp. 238–242 (Oct. 25–27, 1978).

Sabel, L.P., "A DSP Implementation of a Robust Flexible Receiver/Demultiplexer for Broadcast Data Satellite Communications," *The Institution of Engineers Australia Communications Conference*, Institution of Engineers, Australia, pp. 218–223 (Oct. 16–18, 1990).

Salous, S., "IF digital generation of FMCW waveforms for wideband channel characterization," *IEE Proceedings–I*, IEE, vol. 139, No. 3, pp. 281–288 (Jun. 1992).

"Sampling Loops Lock Sources to 23 Ghz," *Microwaves & RF*, Penton Publishing, p. 212 (Sep. 1990).

Sasikumar, M. et al., "Active Compensation in the Switched–Capacitor Biquad," *Proceedings of the IEEE*, IEEE, vol. 71, No. 8, pp. 1008–1009 (Aug. 1983).

Saul, P.H., "A GaAs MESFET Sample and Hold Switch," *Fifth European Solid State Circuits Conference–ESSCIRC 79*, IEE, pp. 5–7 (1979).

Shen, D.H. et al., "A 900–MHZ RF Front–End with Integrated Discrete–Time Filtering," *IEEE Journal of Solid–State Circuits*, IEEE Solid–State Circuits Council, vol. 31, No. 12, pp. 1945–1954 (Dec. 1996).

Shen, X.D. and Vilar, E., "Anomalous transhorizon propagation and meteorological processes of a multilink path," *Radio Science*, American Geophysical Union, vol. 30, No. 5, pp. 1467–1479 (Sep.–Oct. 1995).

Shen, X. and Tawfik, A.N., "Dynamic Behaviour of Radio Channels Due to Trans–Horizon Propagation Mechanisms," *Electronics Letters*, IEE, vol. 29, No. 17, pp. 1582–1583 (Aug. 19, 1993).

Shen, X. et al., "Modeling Enhanced Spherical Diffraction and Troposcattering on a Transhorizon Path with aid of the parabolic Equation and Ray Tracing Methods," *IEE Colloquium on Common modeling techniques for electromagnetic wave and acoustic wave propagation*, IEE, pp. 4/1–4/7 (Mar. 8, 1996).

Shen, X. and Vilar, E., "Path loss statistics and mechanisms of transhorizon propagation over a sea path," *Electronics Letters*, IEE, vol. 32, No. 3, pp. 259–261 (Feb. 1, 1996).

Shen, D. et al., "A 900 MHZ Integrated Discrete–Time Filtering RF Front–End," *IEEE International Solid State Circuits Conference*, IEEE, vol. 39, pp. 54–55 and 417 (Feb. 1996).

Spillard, C. et al., "X–Band Tropospheric Transhorizon Propagation Under Differing Meteorological Conditions," *Sixth International Conference on Antennas and Propagation (ICAP 89) Part 2: Propagation*, IEE, pp. 451–455 (Apr. 4–7, 1989).

Stafford, K.R. et al., "A Complete Monolithic Sample/Hold Amplifier," *IEEE Journal of Solid–State Circuits*, IEEE, vol. SC–9, No. 6, pp. 381–387 (Dec. 1974).

Staruk, W. Jr. et al., "Pushing HF Data Rates," *Defense Electronics*, EW Communications, vol. 17, No. 5, pp. 211, 213, 215, 217, 220 and 222 (May 1985).

Stephenson, A.G., "Digitizing multiple RF signals requires an optimum sampling rate," *Electronics*, McGraw–Hill, pp. 106–110 (Mar. 27, 1972).

Sugaman, R., "Sampling Oscilloscope for Statistically Varying Pulses," *The Review of Scientific Instruments*, American Institute of Physics, vol. 28, No. 11, pp. 933–938 (Nov. 1957).

Sylvain, M., "Experimental probing of multipath microwave channels," *Radio Science*, American Geophysical Union, vol. 24, No. 2, pp. 160–178 (Mar.–Apr. 1989).

Takano, T., "NOVEL GaAs Pet Phase Detector Operable To Ka Band," *IEEE MT–S Digest*, IEEE, pp. 381–383 (1984).

Tan, M.A., "Biquadratic Transconductance Switched–Capacitor Filters," *IEEE Transactions on Circuits and Systems– I: Fundamental Theory and Applications*, IEEE Circuits and Systems Society, vol. 40, No. 4, pp. 272–275 (Apr. 1993).

Tanaka, K. et al., "Single Chip Multisystem AM Stereo Decoder IC," *IEEE Transactions on Consumer Electronics*, IEEE Consumer Electronics Society, vol. CE–32, No. 3, pp. 482–496 (Aug. 1986).

Tawfik, A.N., "Amplitude, Duration and Predictability of Long Hop Trans–Horizon X–band Signals Over the Sea," *Electronics Letters*, IEE, vol. 28, No. 6, pp. 571–572 (Mar. 12, 1992).

Tawfik, A.N. and Vilar, E., "Correlation of Transhorizon Signal Level Strength with Localized Surface Meteorological Parameters," *Eighth International Conference on Antennas and Propagation*, Electronics Division of the IEE, pp. 335–339 (Mar. 30–Apr. 2, 1993).

Tawfik, A.N. and Vilar, E., "Dynamic Structure of a Transhorizon Signal at X–band Over a Sea Path," *Sixth International Conference on Antennas and Propagation (ICAP 89) Part 2: Propagation*, IEE, pp. 446–450 (Apr. 4–7, 1989).

Tawfik, A.N. and Vilar, E., "Statistics of Duration and Intensity of Path Loss in a Microwave Transhorizon Sea–Path," *Electronics Letters*, IEE, vol. 26, No. 7, pp. 474–476 (Mar. 29, 1990).

Tawfik, A.N. and Vitar, E., "X–Band Transhorizon Measurements of CW Transmissions Over the Sea– Part 1: Path Loss, Duration of Events, and Their Modeling," *IEEE Transactions on Antennas and Propagation*, IEEE Antennas and Propagation Society, vol. 41, No. 11, pp. 1491–1500 (Nov. 1993).

Temes, G.C. and Tsividis, T., "The Special Section on Switched–Capacitor Circuits," *Proceedings of the IEEE*, IEEE, vol. 71, No. 8, pp. 915–916 (Aug. 1983).

Thomas, G.B., *Calculus and Analytic Geometry*, Third Edition, Addison–Wesley Publishing, pp. 119–133 (1960).

Tomassetti, Q., "An Unusual Microwave Mixer," $16^{th}$ *European Microwave Conference*, Microwave Exhibitions and Publishers, pp. 754–759 (Sep. 8–12, 1986).

Tortoli, P. et al., "Bidirectional Doppler Signal Analysis Based on a Single RF Sampling Channel," *IEEE Transactions on Ultrasonics, Ferroelectrics, and Frequency Control*, IEEE Ultrasonics, Ferroelectrics, and Frequency Control Society, vol. 41, No. 1, pp. 1–3 (Jan. 1984).

Tsividis, Y. and Antognetti, P. (Ed.), *Design of MOS VLSI Circuits for Telecommunications*, Prentice–Hall, p. 304 (1985).

Tsividis, Y., "Principles of Operation and Analysis of Switched–Capacitor Circuits," *Proceedings of the IEEE*, IEEE, vol. 71, No. 8, pp. 926–940 (Aug. 1983).

Tsurumi, H. and Maeda, T., "Design Study on a Direct Conversion Receiver Front–End for 280 MHZ, 900 MHZ, and 2.6 Ghz Band Radio Communication Systems," $41^{st}$ *IEEE Vehicular Technology Conference*, IEEE Vehicular Technology Society, pp. 457–462 (May 19–22, 1991).

Valdmanis, J.A. et al., "Picosecond and Subpicosend Optoelectronics for Measurements of Future High Speed Electronic Devices," *IEDM Technical Digest*, IEEE, pp. 597–600 (Dec. 5–7, 1983).

van de Kamp, M.M.J.L., "Asymmetric signal level disribution due to tropospheric scintillation," *Electronics Letters*, IEE, vol. 34, No. 11, pp. 1145–1146 (May 28, 1998).

Vasseur, H. and Vanheonacker, D., "Characterization of trophospheric turbulent layers from radiosonde data," *Electronics Letters*, IEE, vol. 34, No. 4, pp. 318–319 (Feb. 19, 1998).

Verdone, R., "Outage Probability Analysis for Short–Range Communication Systems at 60 Ghz in ATT Urban Environments," *IEEE Transactions on Vehicular Technology*, IEEE Vehicular Technology Society, vol. 46, No. 4, pp. 1027–1039 (Nov. 1997).

Vierira–Ribeiro, S.A., *Single–IF DECT Receiver Architecture using a Quadrature Sub–Sampling Band–Pass Sigma–Delta Modulator*, Thesis for Degree of Master's of Engineering, Carleton University, UMI Dissertation Services, pp. 1–80 (Apr. 1995).

Vilar, E. et al., "A Comprehensive/Selective MM–Wave Satellite Downlink Experiment on Fade Dynamics," *Tenth International Conference on Antennas and Propagation*, Electronics Division of the IEE, pp. 2.98–2.101 (Apr. 14–17, 1997).

Vilar, E. et al., "A System to Measure LOS Atmospheric Transmittance at 19 Ghz," *AGARD Conference Proceedings No. 346: Characteristics of the Lower Atmosphere Influencing Radio Wave Propagation*, AGARD, pp. 8–1—8–16 (Oct. 4–7, 1983).

Vilar, E. and Smith, H., "A Theoretical and Experimental Study of Angular Scintillations in Earth Space Paths," *IEEE Transactions on Antennas and Propagation*, IEEE, vol. AP–34, No. 1, pp. 2–10 (Jan. 1986).

Vilar, E. et al., "A Wide Band Transhorizon Experiment at 11.6 Ghz," *Eighth International Conference on Antennas and Propagation*, Electronics Division of the IEE, pp. 441–445 (Mar. 30–Apr. 2, 1993).

Vilar, E. and Matthews, P.A., "Amplitude Dependence of Frequency in Oscillators," *Electronics Letters*, IEE, vol. 8, No. 20, pp. 509–511 (Oct. 5, 1972).

Vilar, E. et al., "An experimental mm–wave receiver system for measuring phase noise due to atmospheric turbulence," *Proceedings of the 25$^{th}$ European Microwave Conference*, Nexus House, pp. 114–119 (1995).

Vilar, E. and Burgueño, A., "Analysis and Modeling of Time Intervals Between Rain Rate Exceedances in the Context of Fade Dynamics," *IEEE Transactions on Communications*, IEEE Communications Society, vol. 39, No. 9, pp. 1306–1312 (Sep. 1991).

Vilar, E. et al., "Angle of Arrival Fluctuations in High and Low Elevation Earth Space Paths," *Fourth International Conference on Antennas and Propagation (ICAP 85)*, Electronics Division of the IEE, pp. 83–88 (Apr. 16–19, 1985).

Vilar, E., "Antennas and Propagation: A Telecommunications Systems Subject," *Electronics Division Colloquium on Teaching Antennas and Propagation to Undergraduates*, IEE, pp. 7/1–7/6 (Mar. 8, 1988).

Vilar, E. et al., "CERS★. Millimetre–Wave Beacon Package and Related Payload Doppler Correction Strategies," *Electronics Division Colloquium on CERS– Communications Engineering Research Satellite*, IEE, pp. 10/1–10/10 (Apr. 10, 1984).

Vilar, E. and Moulsley, T.J., "Comment and Reply: Probability Density Function of Amplitude Scintillations," *Electronics Letters*, IEE, vol. 21, No. 14, pp. 620–622 (Jul. 4, 1985).

Vilar, E. et al., "Comparison of Rainfall Rate Duration Distributions for ILE–IFE and Barcelona," *Electronics Letters*, IEE, vol. 28, No. 20, pp. 1922–1924 (Sep. 24, 1992).

Vilar, E., "Depolarization and Field Transmittances in Indoor Communications," *Electronics Letters*, IEE, vol. 27, No. 9, pp. 732–733 (Apr. 25, 1991).

Vilar, E. and Larsen, J.R., "Elevation Dependence of Amplitude Scintillations on Low Elevation Earth Space Paths," *Sixth International Conference on Antennas and Propagation (ICAP 89) Part 2: Propagation*, IEE, pp. 150–154 (Apr. 4–7, 1989).

Vilar, E. et al., "Experimental System and Measurements of Transhorizon Signal Levels at 11 Ghz," *18$^{th}$ European Microwave Conference*, Microwave Exhibitions and Publishers Ltd., pp. 429–435 (Sep. 12–15, 1988).

Vilar, E. and Matthews, P.A., "Importance of Amplitude Scintillations in Millimetric Radio Links," *Proceedings of the 4$^{th}$ European Microwave Conference*, Microwave Exhibitions and Publishers, pp. 202–206 (Sep. 10–13, 1974).

Vilar, E. and Haddon, J., "Measurement and Modeling of Scintillation Intensity to Estimate Turbulence Parameters in an Earth–Space Path," *IEEE Transactions on Antennas and Propagation*, IEEE Antennas and Propagation Society, vol. AP–32, No. 4, pp. 340–346 (Apr. 1984).

Vilar, E. and Matthews, P.A., "Measurement of Phase Fluctuations on Millimetric Radiowave Propagation," *Electronics Letters*, IEE, vol. 7, No. 18, pp. 566–568 (Sep. 9, 1971).

Vilar, E. and Wan, K.W., "Narrow and Wide Band Estimates of Field Strength for Indoor Communications in the Millimetre Band," *Electronics Division Colloquium on Radiocommunications in the Range 30–60 Ghz*, IEE, pp. 5/1–5/8 (Jan. 17, 1991).

Vilar, E. and Faulkner, N.D., "Phase Noise and Frequency Stability Measurements. Numerical Techniques and Limitations," *Electronics Division Colloquium on Low Noise Oscillators and Synthesizer*, IEE, 5 pages (Jan. 23, 1986).

Vilar, E. and Senin, S., "Propagation phase noise identified using 40 Ghz satellite downlink" *Electronics Letters*, IEE, vol. 33, No. 22, pp. 1901–1902 (Oct. 23, 1997).

Vilar, E. et al., "Scattering and Extinction: Dependence Upon Raindrop Size Distribution in Temperate (Barcelona) and Tropical (Belem) Regions," *Tenth International Conference on Antennas and Propagation*, Electronics Division of the IEE, pp. 2.230–2.233 (Apr. 14–17, 1997).

Vilar, E. and Haddon, J., "Scintillation Modeling and Measurement—A Tool for Remote–Sensing Slant Paths," *AGARD Conference Proceedings No. 332: Propagation Aspects of Frequency Sharing, Interference And System Diversity*, AGARD, pp. 27–1—27–13 (Oct. 18–22, 1982).

Vilar, E., "Some Limitations on Ditigal Transmission Through Turbulent Atmosphere," *International Conference on Satellite Communication Systems Technology*, Electronics Division of the IEE, pp. 169–187 (Apr. 7–10, 1975).

Vilar, E. and Matthews, P.A., "Summary of Scintillation Observations in a 36 Ghz Link Across London," *International Conference on Antennas and Propagation Part 2: Propagation*, IEE, pp. 36–40 (Nov. 28–30, 1978).

Vilar, E. et al., "Wideband Characterization of Scattering Channels," *Tenth International Conference on Antennas and Propagation*, Electronics Division of the IEE, pp. 2.353–2.358 (Apr. 14–17, 1997).

Vollmer, A., "Complete GPS Receiver Fits on Two Chips," *Electronic Design*, Penton Publishing, pp. 50, 52, 54 and 56 (Jul. 6, 1998).

*Voltage and Time Resolution in Digitizing Oscilloscopes: Application Note 348*, Hewlett Packard, pp. 1–11 (Nov. 1986).

Wan, K.W. et al., "A Novel Approach to the Simultaneous Measurement of Phase and Amplitude Noises in Oscillator," *Proceedings of the 19$^{th}$ European Microwave Conference*, Microwave Exhibitions and Publishers Ltd., pp. 809–813 (Sep. 4–7, 1989).

Wan, K.W. et al., "Extended Variances and Autoregressive/Moving Average Algorithm for the Measurement and Synthesis of Oscillator Phase Noise," *Proceedings Of the 43$^{rd}$ Annual Symposiun on Frequency Control*, IEEE, pp. 331–335 (1989).

Wan, K.W. et al., "Wideband Transhorizon Channel Sounder at 11 Ghz," *Electronics Division Colloquium on High Bit Rate UHF/SHF Channel Sounders—Technology and Measurement*, IEE, pp. 3/1–3/5 (Dec. 3, 1993).

Wang, H., "A 1–V Multigigahertz RF Mixer Core in 0.5–µm CMOS," *IEEE Journal of Solid–State Circuits*, IEEE Solid–State Circuits Society, vol. 33, No. 12, pp. 2265–2267 (Dec. 1998).

Watson, A.W.D. et al., "Digital Conversion and Signal Processing for High Performance Communications Receivers," *Digital Processing of Signals in Communications*, Institution of Electronic and Radio Engineers, pp. 367–373 (Apr. 22nd–26th, 1985).

Weast, R.C. et al. (Ed.), *Handbook of Mathematical Tables*, Second Edition, The Chemical Rubber Co., pp. 480–485 (1964).

Wiley, R.G., "Approximate FM Demodulation Using Zero Crossings," *IEEE Transactions on Communications*, IEEE, vol. COM–29, No. 7, pp. 1061–1065 (Jul. 1981).

Worthman, W., "Convergence . . . Again," *RF Design*, Primedia, p. 102 (Mar. 1999).

Young, I.A. and Hodges, D.A., "MOS Switched–Capacitor Analog Sampled–Data Direct–Form Recursive Filters," *IEEE Journal of Solid–State Circuits*, IEEE, vol. SC–14, No. 6, pp. 1020–1033 (Dec. 1979).

Translation of Specification and Claims of FR Patent No. 2245130, 3 pages.

Fest, Jean–Pierre, "Le Convertisseur A/N Revolutionne Le Recepteur Radio," *Electronique*, JMJ (Publisher), No. 54, pp. 40–42 (Dec. 1995).

Translation of DE Patent No. 35 41 031 A1, 22 pages.

Translation of EP Patent No. 0 732 803 A1, 9 pages.

Fest, Jean–Pierre, "The A/D Converter Revolutionizes the Radio Receiver," *Electronique*, JMJ (Publisher), No. 54, 3 pages (Dec. 1995). (Translation of Doc. AQ50).

Translation of German Patent No. DE 197 35 798 C1, 8 pages.

Miki, S. and Nagahama, R., *Modulation System II*, Common Edition 7, Kyoritsu Publishing Co., Ltd., pp. 146–154 (Apr. 30, 1956).

Miki, S. and Nagahama, R., *Modulation System II*, Common Edition 7, Kyoritsu Publishing Co., Ltd., pp. 146–149 (Apr. 30, 1956). (Partial Translation of Doc. AQ51).

Rabiner, L.R. and Gold, B., *Theory And Application Of Digital Signal Processing*, Prentice–Hall, Inc., pp. xiii–xii and 40–46 (1975).

English–language Abstract of Japanese Patent Publication No. 08–032556, from http://www1.ipdl.jpo.go.jp, 2 pages (Feb. 2, 1996—Date of publication of application).

English–language Abstract of Japanese Patent Publication No. 08–139524, from http://www1.ipdl.jpo.go.jp, 2 pages (May 31, 1996—Date of publication of application).

English–language Abstract of Japanese Patent Publication No. 59–144249, from http://www1.ipdl.jpo.go.jp, 2 pages (Aug. 18, 1964—Date of publication of application).

English–languge Abstract of Japanese Patent Publication No. 63–054002, from http://www1.ipdl.jpo.go.jp, 2 pages (Mar. 8, 1988—Date of publication of application).

English–language Abstract of Japanese Patent Publication No. 06–237276, from http://www1.ipdl.jpo.go.jp, 2 pages (Aug. 23, 1994—Date of publication of application).

English–language Abstract of Japanese Patent Publication No. 08–023359, from http://www1.ipdl.jpo.go.jp, 2 pages (Jan. 23, 1996—Date of publication of application).

Partial Translation of Japanese Patent Publication No. 47–2314, 3 pages.

Partial Translation of Japanese Patent Publication No. 58–7903, 3 pages.

English–language Abstract of Japanese Patent Publication No. 58–133004, from http://www1.ipdl.jpo.go.jp, 2 pages (Aug. 8, 1993—Date of publication of application).

English–language Abstract of Japanese Patent Publication No. 60–058705, from http://www1.ipdl.jpo.go.jp, 2 pages (Apr. 4, 1985—Date of publication of application).

English–language Abstract of Japanese Patent Publication No. 04–123614, from http://www1.ipdl.jpo.go.jp, 2 pages (Apr. 23, 1992—Date of publication of application).

English–languge Abstract of Japanese Patent Publication No. 04–127601, from http://www1.ipdl.jpo.go.jp, 2 pages (Apr. 28, 1992—Date of publication of application).

English–language Abstract of Japanese Patent Publication No. 05–175730, from http://www1.ipdl.jpo.go.jp, 2 pages (Jul. 13, 1993—Date of publication of application).

English–language Abstract of Japanese Patent Publication No. 05–175734, from http://www1.ipdl.jpl.go.jp, 2 pages (Jul. 13, 1993—Date of publication of application).

English–language Abstract of Japanese Patent Publication No. 07–154344, from http://www1.ipdl.jpo.go.jp, 2 pages (Jun. 16, 1995—Date of publication of application).

English–language Abstract of Japanese Patent Publication No. 07–307620, from http://www1.ipdl.jpo.go.jp, 2 pages (Nov. 21, 1995—Date of publication of application).

Oppenheim, A.V. and Schafer, R.W., *Digital Signal Processing*, Prentice–Hall, pp. vii–x, 6–35, 45–78, 87–121 and 136–165 (1975).

English–language Abstract of Japanese Patent Publication No. 55–066057, from http://www1.ipdl.jpo.go.jp, 1 page (May 19, 1980—Date of publication of application).

English–language Abstract of Japanese Patent Publication No. 63–065587, from http://www1.ipdl.jpo.go.jp, 1 page (Mar. 24, 1988—Date of publication of application).

English–language Abstract of Japanese Patent Publication No. 63–153691, from http://www1.ipdl.jpo.go.jp, 1 page (Jun. 27, 1988—Date of publication of application).

* cited by examiner

MULTI-MODE, MULTI-BAND COMMUNICATION SYSTEM

CROSS-REFERENCE TO OTHER APPLICATIONS

This application claims the benefit of U.S. Provisional Application No. 60/122,805, filed Mar. 3, 1999, incorporated herein by reference in its entirety.

The following applications of common assignee are related to the present application, and are herein incorporated by reference in their entireties:

"Method and System for Down-Converting Electromagnetic Signals," Ser. No. 09/176,022, filed on Oct. 21, 1998.

"Method and System for Frequency Up-Conversion," Ser. No. 09/176,154, filed on Oct. 21, 1998.

"Method and System for Ensuring Reception of a Communications Signal," Ser. No. 09/176,415, filed on Oct. 21, 1998.

"Integrated Frequency Translation and Selectivity," Ser. No. 09/175,966, filed on Oct. 21, 1998.

"Image-Reject Down-Converter and Embodiments Thereof, Such as the Family Radio Service," Ser. No. to be assigned, Attorney Docket No. 1744.0240001, filed Jan. 3, 2000.

"Analog Zero IF FM Decoder and Embodiments Thereof, Such as the Family Radio Service," Ser. No. to be assigned, Attorney Docket No. 1744.0250001, filed Jan. 3, 2000.

"Communication System With Multi-Mode and Multi-Band Functionality and Embodiments Thereof, Such as the Family Radio Service," Ser. No. to be assigned, Attorney Docket No. 1744.0260001, filed Jan. 3, 2000.

BACKGROUND OF THE INVENTION

1. Field of the Invention

The present invention is generally directed to communications systems and methods, and more particularly to a transmission subsystem for use with an integrated communications system that comprises personal radio services, including but not limited to Family Radio Service (FRS) units. The Family Radio Service is one of the Citizens Band Radio Services. It is intended for the use of family, friends, and associates to communicate among themselves within a neighborhood or while on group outings. There are fourteen discreet FRS channels available for use on a "take turns" basis. The FRS unit channel frequencies are:

| Channel No. | (MHz) |
|---|---|
| 1 | 462.5625 |
| 2 | 462.5875 |
| 3 | 462.6125 |
| 4 | 462.6375 |
| 5 | 462.6625 |
| 6 | 462.6875 |
| 7 | 462.7125 |
| 8 | 467.5625 |
| 9 | 467.5875 |
| 10 | 467.6125 |
| 8 | 467.5625 |
| 9 | 467.5875 |
| 10 | 467.6125 |
| 11 | 467.6375 |
| 12 | 467.6625 |
| 13 | 467.6875 |
| 14 | 467.7125 |

Other selected technical specifications are:
(a) Frequency modulation (although phase modulation is allowed);
(b) Frequency tolerance of each FRS unit must be maintained within 0.00025%;
(c) The authorized bandwidth for an FRS unit is 12.5 kHz; and
(d) Effective radiated power (ERP) shall not, under any condition of modulation, exceed 0.500 W.

The operating rules for the FRS are found at 47 C.F.R. 95.191–95.194. For additional technical information, see 47 C.F.R. 95.601–95.669.

2. Related Art

Modern day communication systems employ components such as transmitters and receivers to transmit information between two users. To accomplish this transmission, information is imparted on a carrier signal and the carrier signal is then transmitted. Typically, the carrier signal is at a frequency higher than the baseband frequency of the information signal. Typical ways that the information is imparted on the carrier signal are called modulation.

A variety of FRS units are available. Typically they are transceivers which operate on one of fourteen channels. Each unit may be able to operate on more than one channel, but, typically, can receive or transmit on only one channel at a time.

SUMMARY OF THE INVENTION

The present invention is directed toward a multi-mode, multi-band communication system that can transmit and/or receive one or more information signals on one or more transmission frequencies using one or more modulation schemes. The invention described herein is directed to the transmission subsystem of the communications system. According to embodiments of the invention, the up-conversion section is implemented using a universal frequency translator (UFT).

In an embodiment, the present invention is used in a family radio system. It is to be understood, however, that the invention is not limited to this particular embodiment. Other implementations in communications-related environments are within the scope and spirit of the invention.

The present invention has a number of advantages, including power reduction, tuning reduction, parts reduction, price reduction, size reduction, performance increase, greater efficiency, and increased integration possibilities.

Further features and advantages of the invention, as well as various embodiments of the invention, are described in detail below with reference to the accompanying drawings.

DETAILED DESCRIPTION OF THE PREFERRED EMBODIMENTS

The present invention is directed toward a multi-mode, multi-band communication system that can transmit and/or receive one or more information signals on one or more transmission frequencies using one or more modulation schemes. The invention described herein is directed to the transmission subsystem of the communications system. According to embodiments of the invention, the up-conversion section is implemented using a universal frequency translator (UFT). The transmission subsystem is hereafter referred to as the subsystem, and those skilled in the relevant art(s) will appreciate that the subsystem can be integrated with receiver subsystems, such as, and without limitation, the receiver subsystem described in co-pending application entitled "Communication System With Multi-Mode and Multi-Band Functionality and Embodiments Thereof, Such as the Family Radio Service," Ser. No. to be assigned, Attorney Docket No. 1744.0260001 which is incorporated herein by reference in its entirety.

Figure 1:
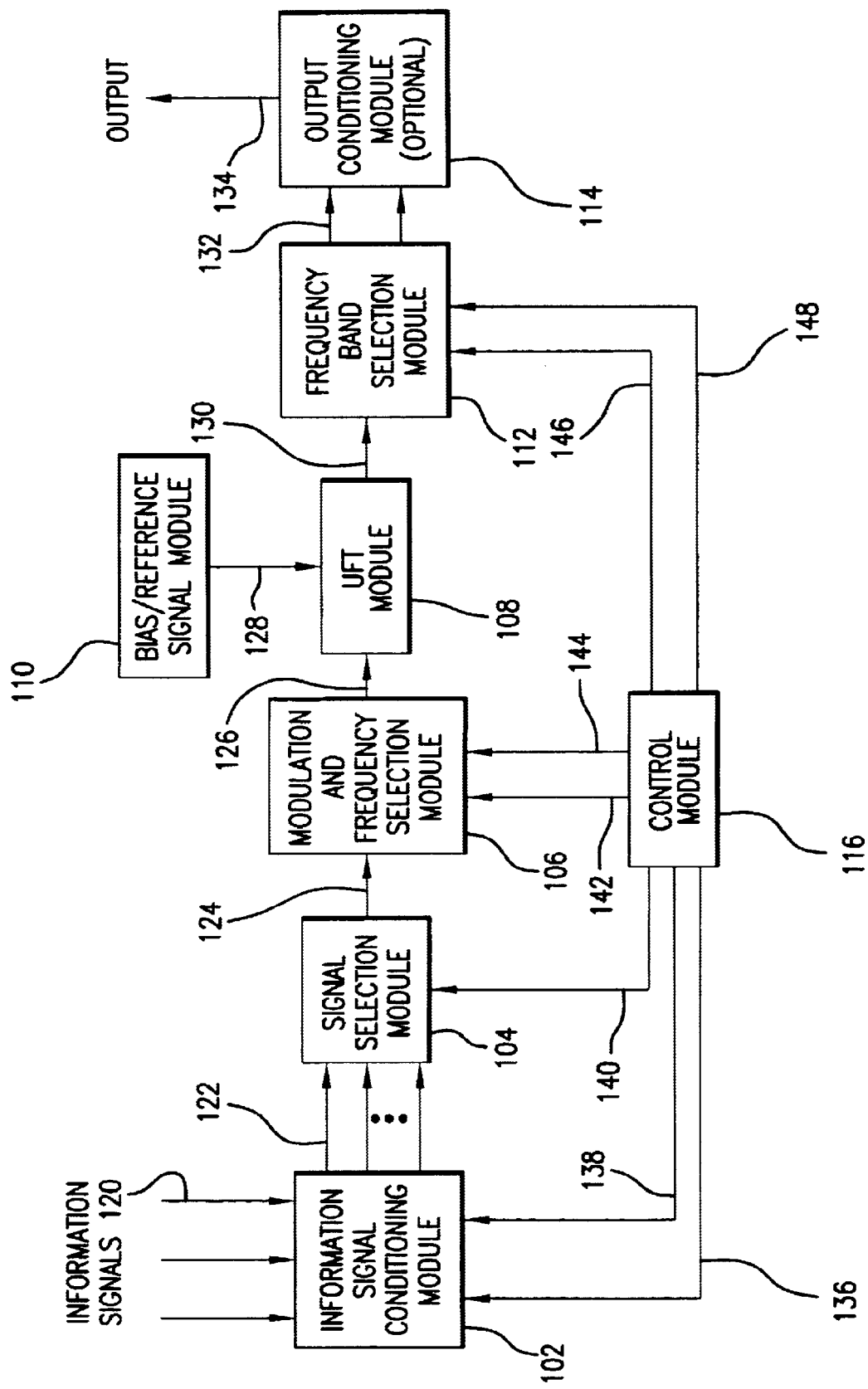
FIG. 1 is a top level block diagram of one embodiment of the transmitter subsystem of the present invention.

The block diagram of FIG. 1 illustrates an embodiment of the present invention. The subsystem is comprised of an information signal conditioning module 102, a signal selection module 104, a modulation and frequency selection module 106, a universal frequency translator (UFT) module 108, a bias/reference module 110, a frequency band selection module 112, an optional output conditioning module 114, and a control module 116. The description provided below is for an implementation of the embodiment wherein a single signal is up-converted and transmitted at any time. Those skilled in the relevant art(s) will understand, based on the teachings contained herein, that more than one information signal can be modulated, up-converted, and transmitted simultaneously and be within the spirit and scope of the invention.

Looking to the structural diagram of FIG. 1, it is seen that one or more information signals 120 are received by information signal conditioning module 102 and one or more conditioned information signals 122 are output. The one or more conditioned information signals 122 are routed to signal selection module 104. Signal selection module 104 determines which of the one or more information signals 120 are to be transmitted at any time. In other words, signal selection module 104 selects one of the information signals 120 for transmission. Selected information signal 124 is output from signal selection module 104 and routed to modulation and frequency selection module 106. The purpose of modulation and frequency selection module 106 is to ensure that the desired modulation scheme and desired output frequency are achieved.

Modulation and frequency selection module 106 outputs an oscillating signal 126. UFT module 108 receives oscillating signal 126 and a bias/reference signal 128 from bias/reference signal module 110. The output of UFT module 108 is a substantially rectangular signal 130 comprised of a plurality of harmonics. Rectangular signal 130 is routed to frequency band selection module 112 which outputs one or more desired output signals 132 (each of which correspond to one of the harmonics of rectangular signal 130), which are then routed to optional output conditioning module 114. An output signal 134 is generated by optional output conditioning module 114 and is routed to appropriate transmission devices, such as one or more antennas (not shown).

The overall operation of the subsystem is controlled by control module 116, which outputs a format control signal 136, a buffer control signal 138, a signal selection control signal 140, a modulation control signal 142, a frequency control signal 144, a band selection control signal 146, and a filter control signal 148.

The subsystem will now be described in greater detail.

Figure 2:
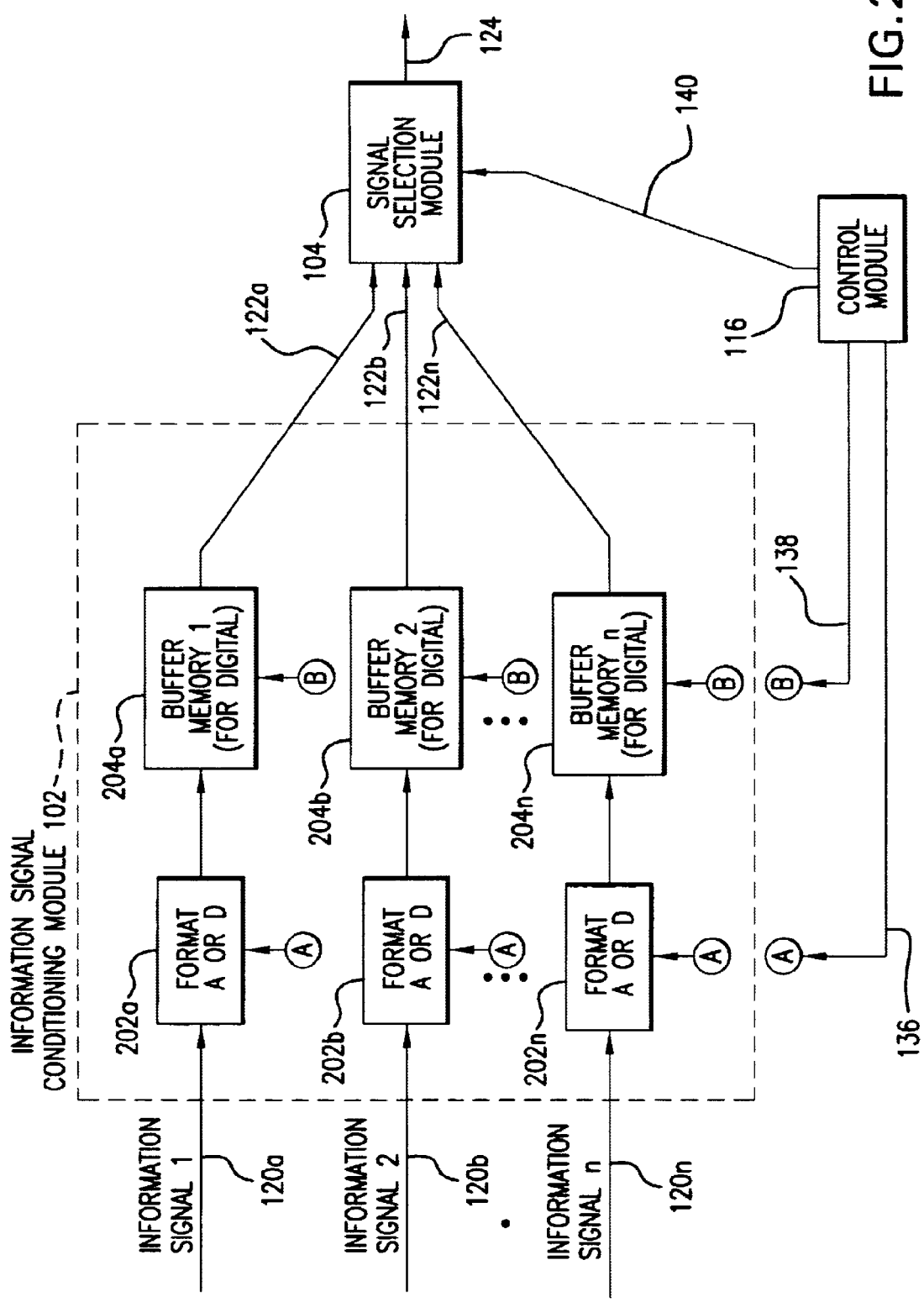
FIG. 2 is a block diagram of an exemplary embodiment of the information signal conditioning module and the signal selection module.

Referring to FIG. 2, it is seen that information signals 120 are received by information signal conditioning module 102. For case of explanation, and not of limitation, it is assumed that any required amplification or filtering of information signals 120 will have been achieved prior to acceptance by information signal conditioning module 102. Additionally, information signal conditioning module 102 receives format control signal 136 and buffer control signal 138.

An example of the operation of information signal conditioning module 102 follows. It is provided for illustrative purposes only, and is not meant to be limiting. A format module 202a receives an information signal 120a, and, based on instructions contained in format control signal 136, converts information signal 120a from digital to analog, from analog to digital, or allows it to pass unchanged. If this signal is digital, it may be passed to a buffer memory 204a which also receives buffer control signal 138. Based on buffer control signal 138, digital information signal 120a is either passed directly out of information signal conditioning module 102 as a conditioned information signal 122a, or it is temporarily stored in buffer memory 204a. A condition under which a digital information signal 120a might be stored in buffer memory 204a is when another information signal (e.g., information signal 120b) is being modulated, up-converted, and transmitted. In this manner, multiple information signals can be transmitted sequentially with minimal loss of information. If the signal is analog, it will pass directly out of information signal conditioning module 102 as conditioned information signal 122a.

Signal selection module 104 receives conditioned information signals 122 and signal selection control signal 140. Based on the control given, signal selection module 104 selects which conditioned information signal 122 is to be output as selected information signal 124. The operation of signal selection module 104 underscores the highly integrated nature of control module 116. As an example, signal selection module 104 should not select a conditioned information signal 122 that is being stored in buffer memory 204, until that signal is ready to be transferred.

Those skilled in the relevant art(s) will understand that the functions performed by information signal conditioning module 102 are not required elements in the invention. For example, if information signals 120 are all in the proper format (i.e., no A-to-D or D-to-A conversion is required), and there is no requirement for them to be buffered (e.g., they are all analog), signal selection module 104 will receive information signals 120 directly. Similarly, depending on system requirements, format modules 202 may be eliminated while retaining buffer memories 204 (i.e., the signals are already in a desired digital format), or buffer memories 204 may be eliminated while retaining format modules 202. Both the inclusion or elimination of any of the functions performed by the information signal conditioning module 102 is within the spirit and scope of the invention.

Figure 3:
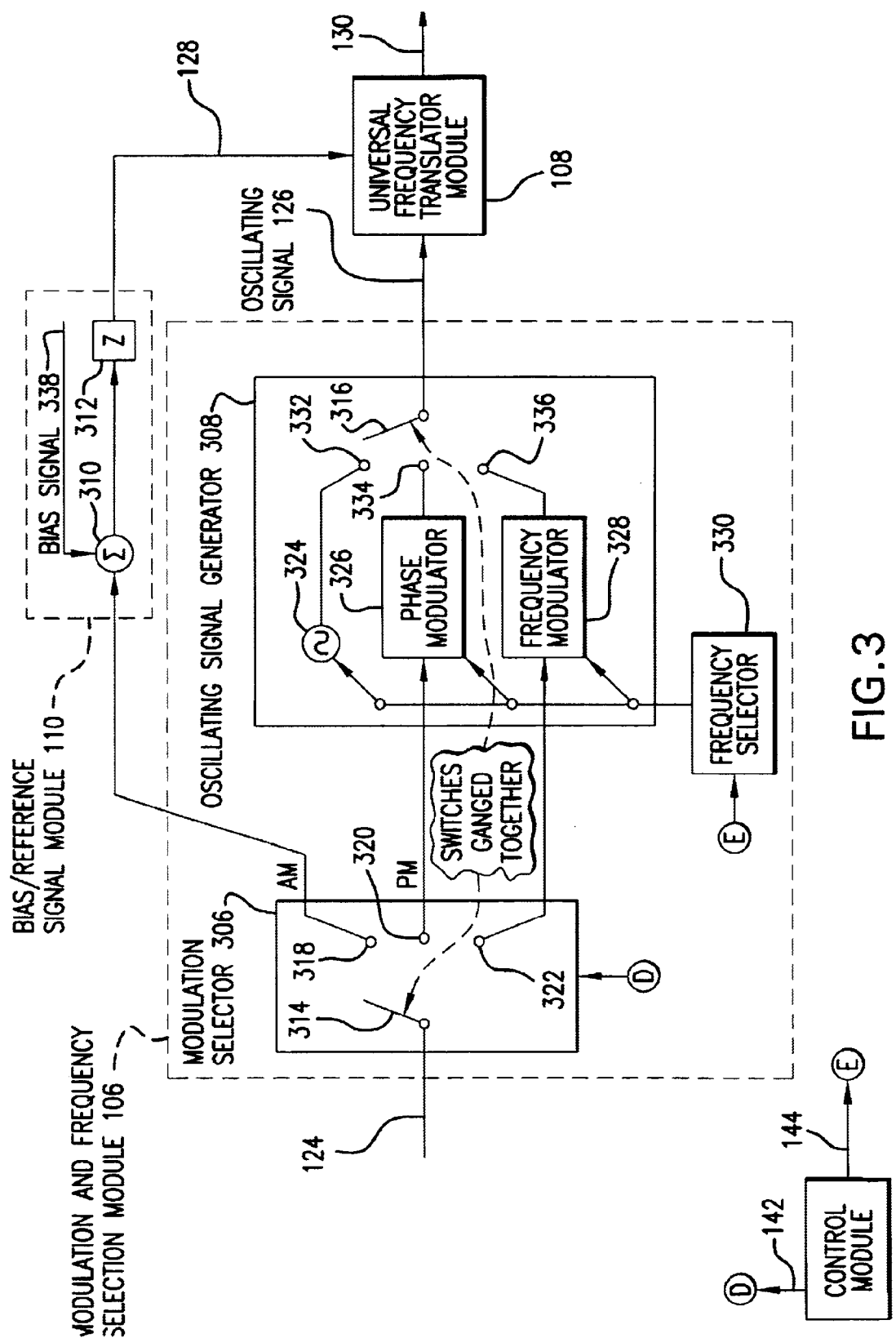
FIG. 3 is a block diagram of an exemplary embodiment of the modulation and frequency selection module and an exemplary embodiment of the bias/reference signal module.

FIG. 3 illustrates an exemplary structure of modulation and frequency selection module 106 and of bias/reference signal module 110. Modulation and frequency selection module 106 is preferably comprised of a modulation selector 306, an oscillating signal generator 308, and a frequency selector 330. Bias/reference signal module 110 is preferably comprised of a summer 310 and an impedance 312.

Selected information signal 124 is received by modulation selector 306. The operation of modulation selector 306 is controlled by modulation control signal 142. The purpose of modulation selector 306 is to effect the proper modulation of selected information signal 124. Thus, a switch 314 is coupled to a contact 318 when amplitude modulation (AM) is desired, to a contact 320 when phase modulation (PM) is desired, and to a contact 322 when frequency modulation (FM) is desired. For ease of illustration and not limiting, only single modulation is discussed herein. However, those skilled in the relevant art(s) will understand, based on the teachings contained herein, that more elaborate, multiple modulation schemes, such as, and without limitation, In-phase/Quadrature-phase ("I/Q") modulation, quadrature amplitude modulation (QAM), AM on angle modulation (i.e., FM or PM), etc., are covered by the spirit and scope of the invention. A more thorough discussion of different modulation schemes is contained in co-pending U.S. patent application Ser. No. 09/176,154, entitled "Method and System for Frequency Up-Conversion," filed Oct. 21, 1998, the full disclosure of which is incorporated herein by reference.

When AM is desired, switch 314 is coupled to contact 318, and selected information signal 124 is routed to bias/reference signal module 110 where it is summed with a bias signal 338 by summer 310. To avoid bias/reference signal 128 being shorted directly to ground, impedance 312 is placed in series between the source of bias/reference signal 128 and UFT module 108.

When PM is desired, switch 314 is coupled to contact 320, and selected information signal 124 is routed to oscillating signal generator 308. Selected information signal 124 is then coupled to a phase modulator 326.

Similarly, when FM is desired, switch 314 is coupled to contact 322, and selected information signal 124 is routed to oscillating signal generator 308 where it is coupled to a frequency modulator 328.

The operation of frequency selector 330 is controlled by frequency control signal 144. Frequency selector 330 controls the operation of frequency modulator 328, phase modulator 326, and an oscillator 324 such that the frequency of oscillating signal 126 is a desired sub-harmonic of the frequency of desired output signal 134. A more thorough discussion of harmonics and sub-harmonics is contained in co-pending U.S. patent application Ser. No. 09/176,154 entitled "Method and System for Frequency Up-Conversion," filed Oct. 21, 1998, the full disclosure of which is incorporated herein by reference.

Oscillating signal generator 308 also includes a switch 316 that is ganged together with switch 314 such that when switch 314 is coupled to contact 318 (for AM), switch 316 is coupled to contact 332. Thus, for AM, oscillating signal 126 is an unmodulated oscillating signal having a frequency that is a sub-harmonic of the frequency of the desired output signal 134, and bias/reference signal 128 is a function of selected information signal 124.

Similarly, when switch 314 is coupled with contact 320 (for PM), switch 316 is coupled to contact 334, and oscillating signal 126 is the output of phase modulator 326 and is a phase modulated oscillating signal having a frequency that is a sub-harmonic of the frequency of the desired output signal 134. For PM, bias/reference signal 128 is comprised of bias signal 338.

When FM is desired, switch 314 is coupled to contact 322 and switch 316 is coupled to contact 336. Thus, oscillating signal 126 is the output of frequency modulator 326 and is a frequency modulated oscillating signal having a frequency that is a sub-harmonic of the frequency of the desired output signal 134. For FM, bias/reference signal 128 is comprised of bias signal 338.

Those skilled in the relevant art(s) will understand, based on the teachings contained herein, that if additional modulation schemes are desired, they may be added.

In addition, those skilled in the relevant art(s) will understand, based on the teachings contained herein, that if the intended operation of a communication system in general, and the transmitter subsystem in particular, is not intended to include one or more modulation schemes described above, then modulation and frequency selection module 106 and bias/reference signal module 110 can be designed without the unneeded circuits. As an example of an alternative implementation, if the subsystem is to be used only to transmit FM signals, modulation selector 306, summer 310, oscillator 324, phase modulator 326, switch 316, and contacts 332, 334, 336, as well as modulation control signal 142 can be eliminated. In this alternative implementation, selected information signal 124 is routed directly to frequency modulator 328, the output of which is oscillating signal 126. Note that frequency modulator 328 is still controlled by frequency control signal 144.

Those skilled in the relevant art(s) will recognize that alternative circuit designs exist that will accomplish the intent of the above descriptions, and fall within the scope and spirit of the invention.

Figure 4:
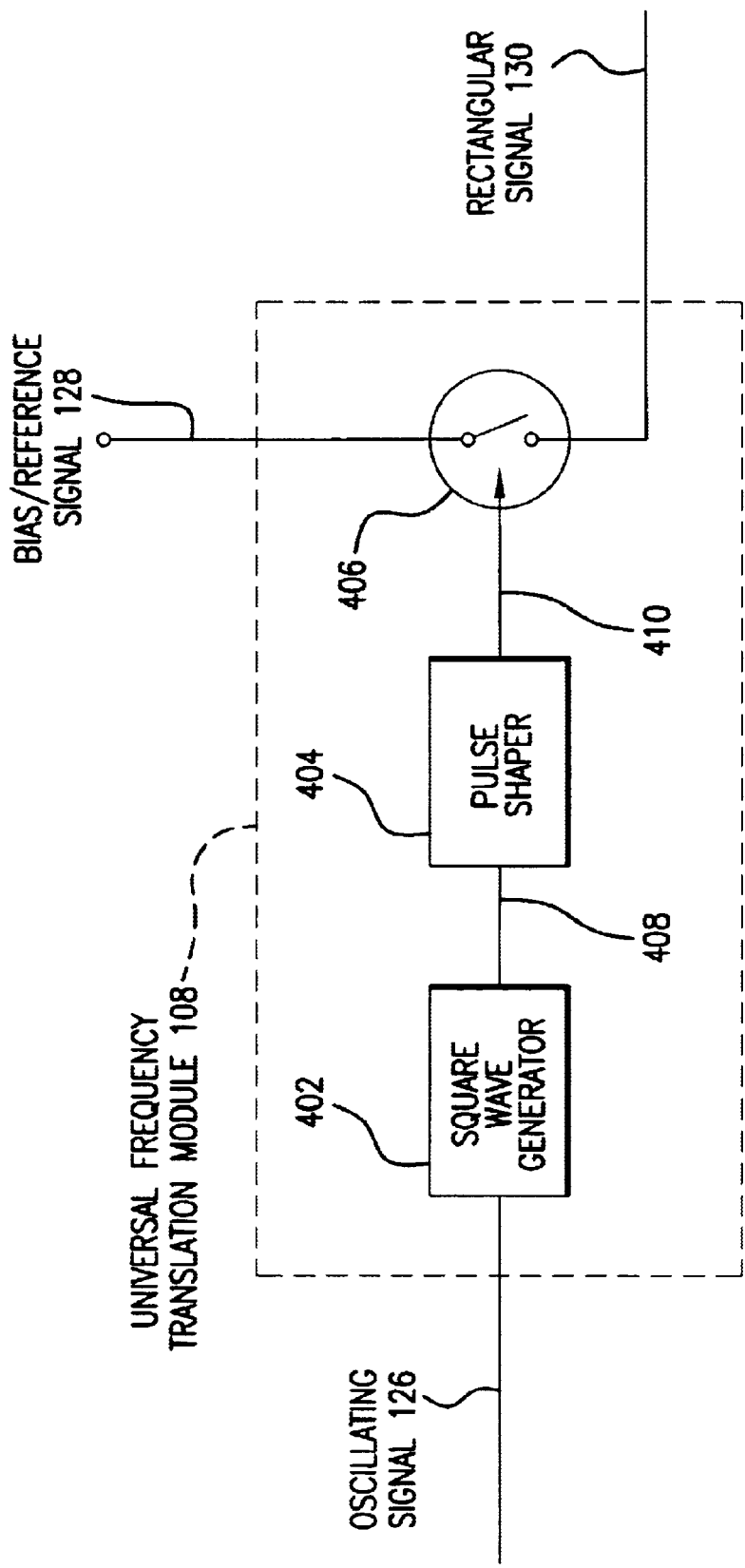
FIG. 4 illustrates an exemplary block diagram of the universal frequency translator module being used in the transmitter subsystem embodiment of the present invention.

The output of modulation and frequency selection module 106 is oscillating signal 126, which is routed to UFT module 108. An exemplary structure of UFT 108 is seen in FIG. 4. UFT module 108 is preferably comprised of a square wave generator 402, a pulse shaper 404, and a switch 406. The use of UFT module 108 as a transmitter is further described in co-pending U.S. patent application Ser. No. 09/176,154 entitled "Method and System for Frequency Up-Conversion," filed Oct. 21, 1998, the full disclosure of which is incorporated herein by reference.

FIG. 4 illustrates oscillating signal 126 being accepted by square wave generator 402 to create a square wave 408 from the periodic waveform of oscillating signal 126. Square wave generators useful for operation with the invention are well known. Square wave 408 has substantially the same frequency and modulation (if any) as does oscillating signal 126. Square wave 408 is then routed to pulse shaper 404 to create a string of pulses 410. In one embodiment, string of pulses 410 has substantially the same frequency and modulation (if any) as does oscillating signal 126. In one implementation, pulse shaper 404 is a mono-stable multi-vibrator. In an alternate embodiment, the frequency of string of pulses 410 is not the same as the frequency of oscillating signal 126. The string of pulses 410 controls switch 406 to create rectangular signal 130. Preferably, pulse shaper 404 is designed such that each pulse in string of pulses 410 has a pulse width "τ" that is substantially equal to (n/2)·T, where "T" is the period of desired output signal 134, and "n" is any odd number. A more thorough discussion of pulse width selection is contained in co-pending U.S. patent application Ser. No. 09/176,154 entitled "Method and System for Frequency Up-Conversion," filed Oct. 21, 1998, the full disclosure of which is incorporated herein by reference.

Another input to UFT module 108 is bias/reference signal 128, which, in this embodiment, is connected to the opposite terminal of switch 406 from rectangular signal 130. When string of pulses 410 controls switch 406 (i.e., causes switch 406 to close and open), bias/reference signal 128 is gated to a second potential (e.g., ground, not shown), thereby creating rectangular signal 130.

Figure 5:
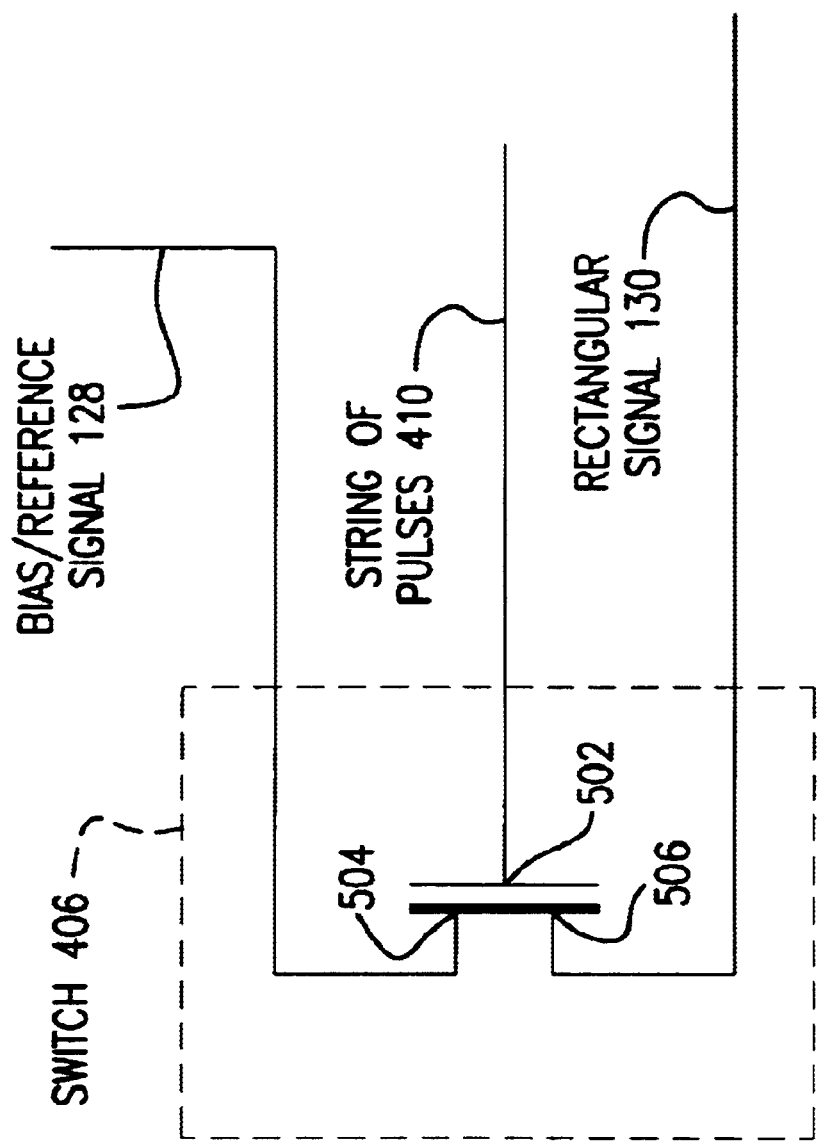
FIG. 5 illustrates an exemplary implementation of a switch in the universal frequency translator module of FIG. 4.

In one implementation of the invention, switch 406 is a field effect transistor (FET). A specific implementation wherein the FET is a complementary metal oxide semiconductor (CMOS) FET is shown in FIG. 5. A CMOS FET has three terminals: a gate 502, a source 504, and a drain 506. String of pulses 410 is connected to gate 502, bias/reference signal 128 is connected to source, 504, and rectangular signal 130 is connected to drain 506. Those skilled in the relevant art(s) will appreciate that the source and drain of a FET are interchangeable, and that bias/reference signal 128 could be at drain 506, with rectangular waveform 130 being at source 504. Numerous circuit designs are available to eliminate any possible asymmetry, and an example of such a circuit may be found in co-pending U.S. patent application Ser. No. 09/176,154 entitled "Method and System for Frequency Up-Conversion," filed Oct. 21, 1998, the full disclosure of which is incorporated herein by reference.

The output of UFT module 108 is rectangular signal 130 that contains a plurality of harmonics. Rectangular signal 130 is sometimes referred to as a harmonically rich signal. Rectangular signal 130 is accepted by frequency band selection module 112 which filters out any undesired harmonic frequencies and outputs desired output signals 132 which are the harmonics of rectangular signal 130 that were not filtered out by frequency band selection module 112. Desired output signals 132 are modulated signals at the desired output frequency.

Figure 6:
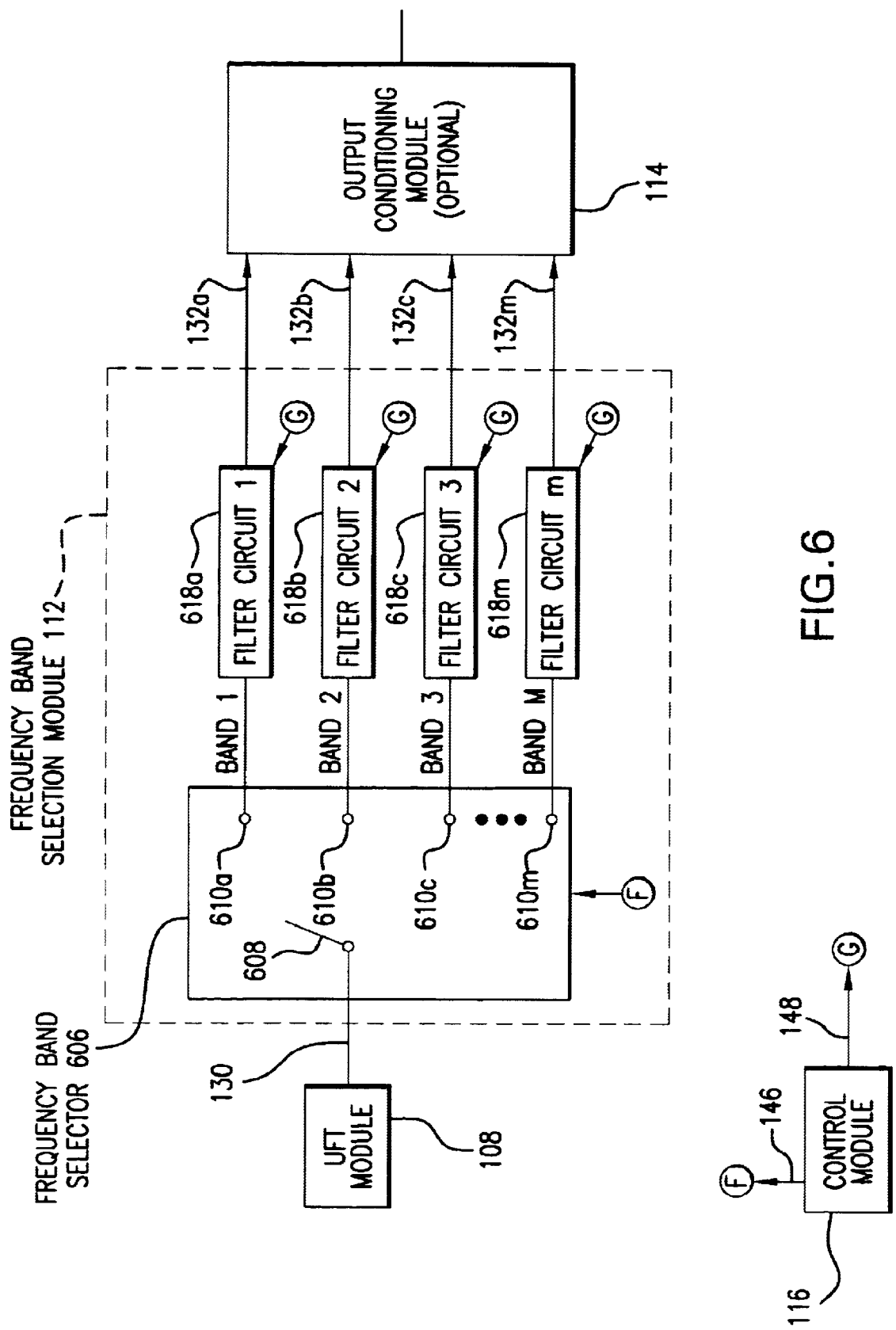
FIG. 6 illustrates an exemplary structure for a frequency band selection module.

An exemplary structure for frequency band selection module 112 is shown in FIG. 6. Rectangular signal 130 is received by frequency band selection module 112. To accommodate the wide range of possible output frequencies for output signal 134 (for example, and not meant to be limiting, output signal 134 may have frequencies ranging from 10 KHz to 3.5 GHz), a frequency band selector 606 and a parallel network of filter circuits 618 are shown. It will be apparent to those skilled in the relevant art(s), based on the teachings contained herein, that it would be within the spirit and scope of the invention if the desired output frequency range were to be accommodated by a single filter circuit. One such filter is described in co-pending U.S. patent application Ser. No. 09/175,966 entitled "Integrated Frequency Translation and Selectivity," filed on Oct. 21, 1998, the full disclosure of which is incorporated herein by reference.

In the implementation shown here, frequency band selection module 112 is comprised of a frequency band selector 606 and one or more filter circuits 618. Frequency band selector 606 is further comprised of a switch 608 and one or more contacts 610. The purpose of frequency band selection module 112 is to accommodate the wide range of possible output frequencies for output signal 134. Those skilled in the relevant art(s) will understand, based on the teachings contained herein, that the exact number of filter circuits 618 will depend, inter alia, on the actual desired frequency range of output signal 134 and the components and design of each filter.

In an exemplary scenario, frequency band selector 606, being controlled by band selection control signal 146, will, for example, be coupled to contact 610a for desired output frequencies between 10 KHz and 100 KHz (referred to herein as "Band 1"), coupled to contact 610b for desired output frequencies between 100 KHz and 10 MHz (referred to herein as "Band 2"), coupled to contact 610c for desired output frequencies between 10 MHz and 500 MHz (referred to herein as "Band 3"), and coupled to contact 610m for desired output frequencies above 1 GHz (referred to herein as "Band m"). These examples are provided for illustrative purposes only, and are not meant to be limiting. Each band is then filtered by its respective filter circuit. That is, "Band 1" is filtered by filter circuit 618a, "Band 2" is filtered by filter circuit 618b, "Band 3" is filtered by filter circuit 618c, and "Band m" is filtered by filter circuit 618m. In this manner, part selection and design of filter circuits 618 can be substantially tailored for their respective frequency band.

Filter circuits 618 are controlled by filter control signal 148 to specifically tune each filter for the specific output frequency. In the example above, if the desired output frequency is 467.6125 MHz (i.e., channel 10 of the Family Radio Service), switch 608 would couple with contact 610c, and filter circuit 618c would respond to filter control signal 148 to tune its components to band pass only the desired frequency. A more thorough discussion of filter design is contained in co-pending U.S. patent application Ser. No. 09/176,154 entitled "Method and System for Frequency Up-Conversion," filed Oct. 21, 1998, the full disclosure of which is incorporated herein by reference. This example is provided for illustrative purposes only, and is not meant to be limiting.

Figure 7:
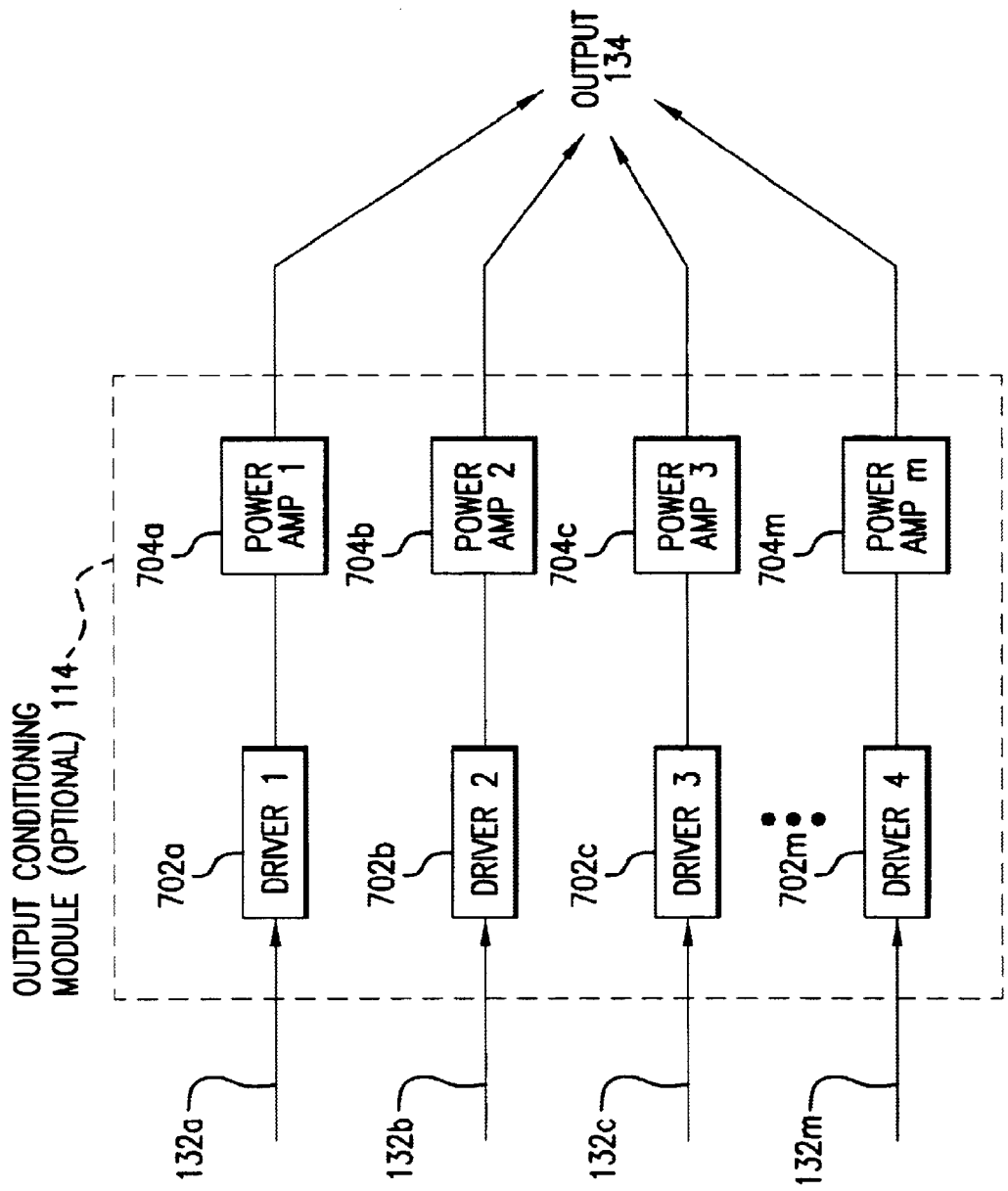
FIG. 7 illustrates an exemplary structure for the optional output conditioning module.

The outputs of filter circuits 618 are desired output signals 132. Desired output signals 132 are then routed to optional output conditioning module 114, an embodiment of which is shown in FIG. 7. Optional output condition module 114 is preferably comprised of one or more drivers 702 and one or more power amplifiers 704. Those skilled in the relevant art(s) will understand, based on the teachings contained herein, that the requirement for drivers 702 and/or power amplifiers 704 is dependent on a number of factors. In the above implementation, the frequency of oscillating signal 126 is a sub-harmonic of the frequency of desired output signal 132. It will be understood by those skilled in the relevant art(s) that the selection of the frequencies will have an impact on the amplitude of the desired output signal 132, and will be a determinative factor as to whether or not drivers 702 and/or power amplifiers 704 will be needed. A more thorough discussion of this is contained in co-pending U.S. patent application Ser. No. 09/176,154 entitled "Method and System for Frequency Up-Conversion," filed Oct. 21, 1998, the full disclosure of which is incorporated herein by reference.

The output of power amplifiers 704 is output signal 134. Output signal 134 is then routed to appropriate transmission devices, such as one or more antennas (not shown).

Conclusion

The embodiments and implementations described above are provided for purposes of illustration. These embodiments and implementations are not intended to limit the invention. Alternate embodiments and implementations, such as but not limited to software, software/hardware, and firmware implementations of the system and components of the system, are possible and are covered by the invention. Embodiments and implementations, differing slightly or substantially from those described herein, including but not limited to, combinations of modulation techniques in an "I/Q" mode, fall within the scope and spirit of the present invention, and will be apparent to those skilled in the relevant art(s) based on the teachings contained herein.

What is claimed is:

1. A method of communicating, comprising the steps of:
   (1) selecting an information signal from one or more information signals as a selected information signal;
   (2) determining a desired frequency for an oscillating signal;
   (3) modulating said oscillating with said selected information signal according to a desired modulation scheme to create a modulated oscillating signal;
   (4) gating a bias signal at a rate that is a function of said modulated oscillating signal to create an angle modulated harmonically rich signal;
   (5) enabling a filter circuit to process said angle modulated harmonically rich signal; and
   (6) filtering, in said filter circuit, said angle modulated harmonically rich signal to isolate one or more desired harmonics, each of said one or more desired harmonics being a desired output signal having a desired output frequency,
   wherein said gating step is performed by a frequency translation module having a square wave generator that accepts said modulated oscillating signal and generates a square wave, a pulse shaper that accepts said square wave and generates a string of pulses, and a switch being controlled by said string of pulses and being connected to said bias signal and generating said harmonically rich signal, said switch having a first port, a second port, and a control port, wherein said string of pulses is connected to said control port, said bias signal is connected to said first port, and said harmonically rich signal is connected to said second port.

2. The method of claim 1, further comprising the step of:
   (7) repeating steps (2)–(6) for another of said one or more information signals.

3. The method of claim 1, wherein step (1) comprises:
   (a) accepting said one or more information signals, wherein said one or more information signals are unconditioned information signals,
   (b) conditioning each of said unconditioned information signals to generate conditioned information signals, and
   (c) selecting one of said conditioned information signals as a selected information signal.

4. The method claim 3, wherein step (1)(b) comprises:
   formatting said unconditioned information signals to create conditioned information signals.

5. The method of claim 3, wherein step (1)(b) comprises:
   (i) formatting said unconditioned information signals to create a properly formatted information signals, and
   (ii) buffering said properly formatted information signals to create conditioned information signals.

6. The method of claim 5, wherein said buffering is a pass-through.

7. The method of claim 3, wherein step (1)(b) comprises:
   buffering said unconditioned information signals to create conditioned information signals.

8. The method of claim 1, wherein step (3) comprises:
   frequency modulating said oscillating signal with said selected information signal according to a desired modulation scheme to create a modulated oscillating signal.

9. The method of claim 1, wherein step (3) comprises:
   phase modulating said oscillating signal with said selected information signal according to a desired modulation scheme to create a modulated oscillating signal.

10. The method of claim 1, wherein said desired frequency for said oscillating signal is a subharmonic of said desired output frequency.

11. The method of claim 1, further comprising the step of:
    (7) conditioning said desired output signal to generate a conditioned output signal.

12. The method of claim 11, wherein step (7) comprises:
    (a) routing said desired output signal through a driver to generate a driven output signal, and
    (b) routing said driven output signal through a power amplifier to generate an amplified output signal, said amplified output signal being said conditioned output signal.

13. The method of claim 11, further comprising the step of:
    (8) transmitting said conditioned output signal.

14. The method of claim 13, wherein step (8) comprises:
    transmitting said conditioned output signal from an antenna.

15. The method of claim 11, further comprising the step of:
    (8) selecting another of said one or more information signals as said selected information signal, and repeating steps (2) through (7).

16. The method of claim 1, wherein step (4) comprises:
    (a) shaping said modulated oscillating signal to create a shaped modulated oscillating signal, and
    (b) gating a bias signal at a rate that is a function of said shaped modulated oscillating signal to create a modulated harmonically rich signal.

17. A method of communicating, comprising the steps of:
    (1) selecting an information signal from one or more information signals as a selected information signal;
    (2) determining a desired frequency for an oscillating signal;
    (3) combining said selected information signal with a bias signal to create a bias/reference signal;
    (4) gating said bias/reference signal at a rate that is a function of said oscillating signal to create an amplitude modulated harmonically rich signal;
    (5) enabling a filter circuit to process said amplitude modulated harmonically rich signal; and
    (6) filtering, in said filter circuit, said amplitude modulated harmonically rich signal to isolate one or more desired harmonics, each of said one or more desired harmonics being a desired output signal having a desired output frequency,
    wherein said gating step is performed by a frequency translation module having a square wave generator that accepts said modulated oscillating signal and generates a square wave, a pulse shaper that accepts said square wave and generates a string of pulses, and a switch being controlled by said string of pulses and being connected to said bias signal and generating said harmonically rich signal, said switch having a first port, a second port, and a control port, wherein said string of pulses is connected to said control port, said bias signal is connected to said first port, said harmonically rich signal is connected to said first port, and a ground is connected to said second port.

18. The method of claim 17, further comprising the step of:

(7) selecting another of said one or more information signals, and repeating steps (2) through (6).

19. The method of claim 17, wherein step (1) comprises:

(a) accepting one or more information signals, wherein said one or more information signals are unconditioned information signals, (b) conditioning each of said unconditioned information signals to generate conditioned information signals, and (c) selecting one of said conditioned information signals as a selected information signal.

20. The method of claim 19, wherein step (1)(b) comprises:

formatting said unconditioned information signals to create conditioned information signals.

21. The method of claim 19, wherein step (1)(b) comprises:

(i) formatting said unconditioned information signals to create properly formatted information signals, and (ii) buffering said properly formatted information signals to create conditioned information signals.

22. The method of claim 21, wherein said buffering is a pass-through.

23. The method of claim 19, wherein step (1)(b) comprises:

buffering said unconditioned information signals to create conditioned information signals.

24. The method of claim 17, wherein said desired frequency for said oscillating signal is a-subharmonic of said desired output frequency.

25. The method of claim 17, further comprising the step of:

(7) conditioning said desired output signal to generate a conditioned output signal.

26. The method of claim 25, wherein step (7) comprises:

(a) routing said desired output signal through a driver to generate a driven output signal, and (b) routing said driven output signal through a power amplifier to generate an amplified output signal, said amplified output signal being said conditioned output signal.

27. The method of claim 25, further comprising the step of:

(8) transmitting said conditioned output signal.

28. The method of claim 27, wherein step (8) comprises:

transmitting said amplified output signal from an antenna.

29. The method of claim 25, further comprising the step of:

(8) selecting another of said one or more information signals as said selected information signal, and repeating steps (2) through (7).

30. The method of claim 17, wherein step (4) comprises:

(a) shaping said oscillating signal to create a shaped oscillating signal, and (b) gating a bias/reference signal at a rate that is a function of said shaped oscillating signal to create an amplitude modulated harmonically rich signal.

31. A system for communicating, comprising:

an information signal conditioning module to accept one or more information signals and to output one or more conditioned information signals, a signal selection module to accept said one or more conditioned information signals and to output a selected information signal, a modulation and frequency selection module to accept said selected information signal and to output an oscillating signal, a frequency translation module to accept said oscillating signal and a bias/reference signal, and to output a harmonically rich signal, and a frequency band selection module to accept said harmonically rich signal and to output one or more desired output signals, wherein said frequency translation module comprises a square wave generator that accepts said oscillating signal and generates a square wave, a pulse shaper that accepts said square wave and generates a string of pulses, and a switch being controlled by said string of pulses and being connected to said bias/reference signal and generating said harmonically rich signal, and wherein said switch has a first port, a second port, and a control port, wherein said string of pulses is connected to said control port, said bias/reference signal is connected to said first port, and said harmonically rich signal is connected to said second port.

32. The system of claim 31, wherein said information signal conditioning module comprises one or more format modules and one or more buffer memories, said one or more format modules to accept said one or more information signals and to output formatted information signals, and said one or more buffer memories to accept said formatted information signals and to output conditioned information signals.

33. The system of claim 32, wherein the quantity of said one or more format modules is equal to the quantity of said one or more information signals.

34. The system of claim 32, wherein the quantity of said one or more buffer memories is equal to the quantity of said formatted information signals.

35. The system of claim 32, wherein the quantity of said one or more buffer memories is equal to the quantity of said one or more format modules.

36. The system of claim 31, wherein said information signal conditioning module comprises one or more format modules, said one or more format modules to accept said one or more information signals and to output conditioned information signals.

37. The system of claim 36, wherein the quantity of said one or more format modules is equal to the quantity of said one or more information signals.

38. The system of claim 31, wherein said information signal conditioning module comprises one or more buffer memories, said one or more buffer memories to accept one of said one or more information signals and to output conditioned information signals.

39. The system of claim 38, wherein the quantity of said one or more buffer memories is equal to the quantity of said one or more information signals.

40. The system of claim 31, wherein said modulation and frequency selection module comprises a modulation selector and an oscillating signal generator, said modulation selector to accept said selected information signal and to direct said selected information signal according to a modulation control signal, and said oscillating signal generator to output said oscillating signal according to a frequency control signal.

41. The system of claim 40, wherein said modulation selector accepts said selected information signal and directs said selected information signal to one of an amplitude modulation path, a phase modulation path, and a frequency modulation path, said amplitude modulation path being between said modulation selector and a bias/reference signal module, said bias/reference signal module to output said bias/reference signal, said phase modulation path and said frequency modulation path being between said modulation selector and said oscillating signal generator, said oscillating signal generator to output said oscillating signal.

42. The system of claim 41, wherein said modulation selector comprises a switch, said switch having an input contact, said input contact to accept said selected information signal, said switch further having at least one output contact.

43. The system of claim 42, wherein said switch comprises a first output contact connected to said amplitude modulation path, a second output contact connected to said phase modulation path, and a third output contact connected to said frequency modulation path.

44. The system of claim 40, wherein said oscillating signal generator comprises an oscillator, said oscillator to create said oscillating signal, and wherein said oscillating signal has an oscillating signal frequency that is a subharmonic of the frequency of one of said one or more desired output signals.

45. The system of claim 40, wherein said oscillating signal generator comprises a phase modulator, said phase modulator to create said oscillating signal, said oscillating signal being a phase modulated oscillating signal that is a function of said selected information signal, said phase modulated oscillating signal having an oscillating signal frequency that is a subharmonic of the frequency of one of said one or more desired output signals.

46. The system of claim 40, wherein said oscillating signal generator comprises a frequency modulator, said frequency modulator to create said oscillating signal, said oscillating signal being a frequency modulated oscillating signal that is a function of said selected information signal, said frequency modulated oscillating signal having an oscillating signal frequency that is a subharmonic of the frequency of one of said one or more desired output signals.

47. The system of claim 40, wherein said oscillating signal generator comprises one or more of an oscillator, a phase modulator, and a frequency modulator.

48. The system of claim 31, further comprising a bias/reference signal module to generate said bias/reference signal.

49. The system of claim 48, wherein said bias/reference signal module comprises a summer to accept said selected information signal and combine it with a bias signal to create said bias/reference signal.

50. The system of claim 48, wherein said bias/reference signal is a non-zero voltage that is substantially constant.

51. The system of claim 48, wherein said bias/reference signal module comprises a bias signal and an impedance, said impedance having a first port and a second port, said bias signal being connected to said first port, and wherein said second port outputs said bias/reference signal.

52. The system of claim 48, wherein said bias/reference signal module comprises a summer to accept said selected information signal and combine it with a bias signal to create a summed signal, and an impedance having a first port and a second port, said summed signal being connected to said first port, and wherein said second port outputs said bias/reference signal.

53. The system of claim 31, wherein said switch is a semiconductor device.

54. The system of claim 53, wherein said semiconductor device is a transistor.

55. The system of claim 54, wherein-said transistor is a field effect transistor.

56. The system of claim 55, wherein said field effect transistor is a complementary metal oxide semiconductor-field effect transistor.

57. The system of claim 55, wherein said field effect transistor is a gallium arsenide field effect transistor.

58. The system of claim 31, wherein said frequency band selection module comprises a frequency band selector to accept said harmonically rich signal, said frequency band selector having one or more outputs connected to one or more filter circuits, said one or more filter circuits to output said one or more desired output signals.

59. The system of claim 58, wherein said frequency band selector routes said harmonically rich signal to one of said one or more filter circuits based on the frequency band of said desired output signal.

60. The system of claim 58, wherein each of said one or more filter circuits is tuned to filter a preselected frequency range.

61. The system of claim 58, wherein said frequency band selector has one or more outputs connected to a single filter circuit.

62. The system of claim 31, further comprising an output conditioning module to accept said one or more desired output signals and to output an output signal.

63. The system of claim 62, wherein said output conditioning module comprises one or more drivers to accept said one or more desired output signals, each of said one or more drivers having a driver output, there being one or more driver outputs, each of said one or more driver outputs, being connected to a power amplifier, there being one or more power amplifiers, each of said one or more power amplifiers having an amplifier output, there being one or more amplifier outputs, wherein one of said one or more amplifier outputs is said output signal.

64. The system of claim 31, further comprising a control module, said control module providing one or more communications control signals to said information signal conditioning module.

65. The system of claim 31, further comprising a control module, said control module providing one or more communications control signals to said signal selection module.

66. The system of claim 31, further comprising a control module, said control module providing one or more communications control signals to said modulation and frequency selection module.

67. The system of claim 31, further comprising a control module, said control module providing one or more communications control signals to said frequency band selection module.

68. A system for communicating, comprising:
an information signal conditioning module to accept one or more information signals and to output one or more conditioned information signals,
a signal selection module to accept said one or more conditioned information signals and to output a selected information signal,
a modulation and frequency selection module to accept said selected information signal and to output an oscillating signal, a frequency translation module to accept said oscillating signal and a bias/reference signal, and to output a harmonically rich signal, and a frequency band selection module to accept said harmonically rich signal and to output one or more desired output signals, wherein said frequency translation module comprises a square wave generator that accepts said oscillating signal and generates a square wave, a pulse shaper that accepts said square wave and generates a string of pulses, and a switch being controlled by said string of pulses and being connected to said bias/reference signal and generating said harmonically rich signal, and wherein said switch has a first port, a second port, and a control port, wherein said string of pulses is connected to said control port, said bias/reference signal is connected to said first port, said harmonically rich signal is connected to said first port, and a ground is connected to said second port.

69. The system of claim 68, wherein said information signal conditioning module comprises one or more format modules and one or more buffer memories, said one or more format modules to accept said one or more information signals and to output formatted information signals, and said one or more buffer memories to accept said formatted information signals and to output conditioned information signals.

70. The system of claim 69, wherein the quantity of said one or more format modules is equal to the quantity of said one or more information signals.

71. The system of claim 69, wherein the quantity of said one or more buffer memories is equal to the quantity of said formatted information signals.

72. The system of claim 69, wherein the quantity of said one or more buffer memories is equal to the quantity of said one or more format modules.

73. The system of claim 68, wherein said information signal conditioning module comprises one or more format modules, said one or more format modules to accept said one or more information signals and to output conditioned information signals.

74. The system of claim 73, wherein the quantity of said one or more format modules is equal to the quantity of said one or more information signals.

75. The system of claim 68, wherein said information signal conditioning module comprises one or more buffer memories, said one or more buffer memories to accept one of said one or more information signals and to output conditioned information signals.

76. The system of claim 75, wherein the quantity of said one or more buffer memories is equal to the quantity of said one or more information signals.

77. The system of claim 68, wherein said modulation and frequency selection module comprises a modulation selector and an oscillating signal generator, said modulation selector to accept said selected information signal and to direct said selected information signal according to a modulation control signal, and said oscillating signal generator to output said oscillating signal according to a frequency control signal.

78. The system of claim 77, wherein said modulation selector accepts said selected information signal and directs said selected information signal to one of an amplitude modulation path, a phase modulation path, and a frequency modulation path, said amplitude modulation path being between said modulation selector and a bias/reference signal module, said bias/reference signal module to output said bias/reference signal, said phase modulation path and said frequency modulation path being between said modulation selector and said oscillating signal generator, said oscillating signal generator to output said oscillating signal.

79. The system of claim 11, wherein said modulation selector comprises a switch, said switch having an input contact, said input contact to accept said selected information signal, said switch further having at least one output contact.

80. The system of claim 79, wherein said switch comprises a first output contact connected to said amplitude modulation path, a second output contact connected to said phase modulation path, and a third output contact connected to said frequency modulation path.

81. The system of claim 77, wherein said oscillating signal generator comprises an oscillator, said oscillator to create said oscillating signal, and wherein said oscillating signal has an oscillating signal frequency that is a subharmonic of the frequency of one of said one or more desired output signals.

82. The system of claim 77, wherein said oscillating signal generator comprises a phase modulator, said phase modulator to create said oscillating signal, said oscillating signal being a phase modulated oscillating signal that is a function of said selected information signal, said phase modulated oscillating signal having an oscillating signal frequency that is a subharmonic of the frequency of one of said one or more desired output signals.

83. The system of claim 77, wherein said oscillating signal generator comprises a frequency modulator, said frequency modulator to create said oscillating signal, said oscillating signal being a frequency modulated oscillating signal that is a function of said selected information signal, said frequency modulated oscillating signal having an oscillating signal frequency that is a subharmonic of the frequency of one of said one or more desired output signals.

84. The system of claim 77, wherein said oscillating signal generator comprises one or more of an oscillator, a phase modulator, and a frequency modulator.

85. The system of claim 68, further comprising a bias/reference signal module to generate said bias/reference signal.

86. The system of claim 85, wherein said bias/reference signal module comprises a summer to accept said selected information signal and combine it with a bias signal to create said bias/reference signal.

87. The system of claim 85, wherein said bias/reference signal is a non-zero voltage that is substantially constant.

88. The system of claim 85, wherein said bias/reference signal module comprises a bias signal and an impedance, said impedance having a first port and a second port, said bias signal being connected to said first port, and wherein said second port outputs said bias/reference signal.

89. The system of claim 85, wherein said bias/reference signal module comprises a summer to accept said selected information signal and combine it with a bias signal to create a summed signal, and an impedance having a first port and a second port, said summed signal being connected to said first port, and wherein said second port outputs said bias/reference signal.

90. The system of claim 68, wherein said switch is a semiconductor device.

91. The system of claim 90, wherein said semiconductor device is a transistor.

92. The system of claim 91, wherein said transistor is a field effect transistor.

93. The system of claim 92, wherein said field effect transistor is a complementary metal oxide semiconductor field effect transistor.

94. The system of claim 92, wherein said field effect transistor is a gallium arsenide field effect transistor.

95. The system of claim 68, wherein said frequency band selection module comprises a frequency band selector to accept said harmonically rich signal, said frequency band selector having one or more outputs connected to one or more filter circuits, said one or more filter circuits to output said one or more desired output signals.

96. The system of claim 95, wherein said frequency band selector routes said harmonically rich signal to one of said one or more filter circuits based on the frequency band of said desired output signal.

97. The system of claim 95, wherein each of said one or more filter circuits is tuned to filter a preselected frequency range.

98. The system of claim 95, wherein said frequency band selector has one or more outputs connected to a single filter circuit.

99. The system of claim 68, further comprising an output conditioning module to accept said one or more desired output signals and to output an output signal.

100. The system of claim 99, wherein said output conditioning module comprises one or more drivers to accept said one or more desired output signals, each of said one or more drivers having a driver output, there being one or more driver outputs, each of said one or more driver outputs being connected to a power amplifier, there being one or more power amplifiers, each of said one or more power amplifiers having an amplifier output, there being one or more amplifier outputs, wherein one of said one or more amplifier outputs is said output signal.

101. The system of claim 68, further comprising a control module, said control module providing one or more communications control signals to said information signal conditioning module.

102. The system of claim 68, further comprising a control module, said control module providing one or more communications control signals to said signal selection module.

103. The system of claim 68, further comprising a control module, said control module providing one or more communications control signals to said modulation and frequency selection module.

104. The system of claim 68, further comprising a control module, said control module providing one or more communications control signals to said frequency band selection module.

* * * * *

UNITED STATES PATENT AND TRADEMARK OFFICE
CERTIFICATE OF CORRECTION

PATENT NO. : 6,704,549 B1
DATED : March 9, 2004
INVENTOR(S) : Sorrells et al.

It is certified that error appears in the above-identified patent and that said Letters Patent is hereby corrected as shown below:

Title page,
Item [73], Assignee, please delete "ParkVision" and insert -- ParkerVision --.
Item [56], References Cited, FOREIGN PATENT DOCUMENTS, please delete "EP     8-139524" and insert -- JP     8-139524 --.
OTHER PUBLICATIONS,
"Press Release, "Parkervision, Inc. Announces Completion of" reference, please delete "Oct. 20" and insert -- Oct. 30 --; and
"Projected COST" reference, please delete "Projected" and insert -- Project --.

Column 1,
Lines 25-27, please delete "Ser. No. to be assigned, Attorney Docket No. 1744.0240001, filed Jan. 3, 2000" and insert -- Ser. No 09/476,091, filed Jan. 3, 2000, now U.S. Pat. No. 6,704,558 --.
Lines 29-30, please delete "Ser. No. to be assigned, Attorney Docket No. 1744.0250001, filed Jan. 3, 2000" and insert -- Ser. No. 09/476,092, filed Jan. 3, 2000 --.
Lines 34-35, please delete "Ser. No. to be assigned, Attorney Docket No. 1744.0260001, filed Jan. 3, 2000" and insert -- Ser. No. 09/476,093, filed Jan. 3, 2000 --.

Column 3,
Lines 33-34, please delete "Ser. No. to be assigned, Attorney Docket No. 1744.0260001 filed Jan. 3, 2000" and insert -- Ser. No. 09/476,093, filed Jan. 3, 2000 --.

Column 10,
Line 20, please delete "through-a" and insert -- through a --.

UNITED STATES PATENT AND TRADEMARK OFFICE
CERTIFICATE OF CORRECTION

PATENT NO. : 6,704,549 B1
DATED : March 9, 2004
INVENTOR(S) : Sorrells et al.

It is certified that error appears in the above-identified patent and that said Letters Patent is hereby corrected as shown below:

Column 11,
Line 37, please delete "a-subharmonic" and insert -- a subharmonic --.

Column 14,
Line 8, please delete "wherein-said" and insert -- wherein said --.
Line 37, please delete "outputs, being" and insert -- outputs being --.

Signed and Sealed this

Eighteenth Day of October, 2005

JON W. DUDAS
*Director of the United States Patent and Trademark Office*